US012584027B2

(12) United States Patent
Amako

(10) Patent No.: US 12,584,027 B2
(45) Date of Patent: Mar. 24, 2026

(54) CURABLE ORGANOPOLYSILOXANE COMPOSITION, AND OPTICAL MEMBER FORMED FROM CURED PRODUCT OF SAME

(71) Applicant: DOW TORAY CO., LTD., Tokyo (JP)

(72) Inventor: Masaaki Amako, Ichihara (JP)

(73) Assignee: DOW TORAY CO., LTD., Shinagawa-ku (JP)

( * ) Notice: Subject to any disclaimer, the term of this patent is extended or adjusted under 35 U.S.C. 154(b) by 1024 days.

(21) Appl. No.: 17/613,616

(22) PCT Filed: May 19, 2020

(86) PCT No.: PCT/JP2020/019725
§ 371 (c)(1),
(2) Date: Nov. 23, 2021

(87) PCT Pub. No.: WO2020/241368
PCT Pub. Date: Dec. 3, 2020

(65) Prior Publication Data

US 2022/0235226 A1 Jul. 28, 2022

(30) Foreign Application Priority Data

May 31, 2019 (JP) ................................ 2019-102545

(51) Int. Cl.
*C09D 7/61* (2018.01)
*C08G 77/12* (2006.01)
(Continued)

(52) U.S. Cl.
CPC ............... *C09D 7/61* (2018.01); *C08G 77/12* (2013.01); *C08G 77/20* (2013.01); *C08K 3/22* (2013.01);
(Continued)

(58) Field of Classification Search
CPC ...................................................... C08L 83/04
See application file for complete search history.

(56) References Cited

U.S. PATENT DOCUMENTS

| | | | |
|---|---|---|---|
| 5,932,145 A | 8/1999 | Mitani et al. | |
| 6,376,635 B1 * | 4/2002 | Amako | C07F 7/0838 556/455 |

(Continued)

FOREIGN PATENT DOCUMENTS

| | | |
|---|---|---|
| EP | 2270100 A1 | 1/2011 |
| JP | 2010018662 A | 1/2010 |

(Continued)

OTHER PUBLICATIONS

Machine assisted English translation of WO2017183800A1 obtained from https://worldwide.espacenet.com/patent on Jun. 6, 2023, 17 pages.

(Continued)

*Primary Examiner* — Michael F Pepitone
(74) *Attorney, Agent, or Firm* — Warner Norcross + Judd LLP

(57) ABSTRACT

Provided herein is a light diffusing material having excellent light transmittance, light diffusivity, and mechanical properties. The light diffusing material comprises a curable organopolysiloxane composition, comprising: A) an organopolysiloxane having reactive groups; B) one or more inorganic fillers; and C) an organosilicon compound that differs from component A), and comprising component(s) C1) and/or C2). Component C1) is an organosilicon compound having a reactive functional group that can bond with component A), a hydrolyzable silyl group and/or a silicon atom-bonded hydroxyl group, and two or more silicon atoms, in the molecule. Component C2) is an organosilicon compound having a reactive functional group with three or more carbon atoms, which can bond with component A), a (Continued)

hydrolyzable silyl group and/or a silicon atom-bonded hydroxyl group, and one or more silicon atoms, in the molecule. The mass of component B) is 30 to 95% relative to the mass of the overall composition.

20 Claims, 1 Drawing Sheet

(51) Int. Cl.

| | |
|---|---|
| ***C08G 77/20*** | (2006.01) |
| ***C08K 3/22*** | (2006.01) |
| ***C08K 3/36*** | (2006.01) |
| ***C08K 5/5419*** | (2006.01) |
| ***C08K 5/5425*** | (2006.01) |
| ***C08K 7/18*** | (2006.01) |
| ***C08L 83/04*** | (2006.01) |
| ***C09D 183/04*** | (2006.01) |
| ***H10K 50/84*** | (2023.01) |
| ***H10K 50/85*** | (2023.01) |

(52) U.S. Cl.

CPC .............. *C08K 3/36* (2013.01); *C08K 5/5419* (2013.01); *C08K 5/5425* (2013.01); *C08K 7/18* (2013.01); *C08L 83/04* (2013.01); *C09D 183/04* (2013.01); *C08K 2003/2227* (2013.01); *C08L 2201/10* (2013.01); *C08L 2203/16* (2013.01); *C08L 2203/20* (2013.01); *C08L 2205/025* (2013.01); *H10K 50/84* (2023.02); *H10K 50/85* (2023.02)

(56) References Cited

U.S. PATENT DOCUMENTS

| | | | | |
|---|---|---|---|---|
| 6,433,057 | B1 | 8/2002 | Bhagwagar et al. | |
| 2003/0229174 | A1* | 12/2003 | Goto ........................ | C08L 83/04 524/588 |
| 2006/0079634 | A1* | 4/2006 | Horikoshi ............... | C08L 83/14 524/588 |
| 2009/0253846 | A1* | 10/2009 | Fukui ....................... | C08L 83/04 524/430 |
| 2013/0197139 | A1 | 8/2013 | Kobayashi et al. | |
| 2013/0274398 | A1 | 10/2013 | Shiobara et al. | |
| 2015/0115311 | A1* | 4/2015 | Yoshida .................. | C08L 83/00 524/264 |
| 2017/0114220 | A1 | 4/2017 | Kusunoki et al. | |
| 2019/0085167 | A1 | 3/2019 | Iwata | |
| 2019/0292349 | A1 | 9/2019 | Ito | |

FOREIGN PATENT DOCUMENTS

| | | | |
|---|---|---|---|
| JP | 2011184625 | A | 9/2011 |
| JP | 2012167253 | A | 9/2012 |
| JP | 2013221075 | A | 10/2013 |
| JP | 2013232580 | A | 11/2013 |
| JP | 2015129213 | A | 7/2015 |
| JP | 2016049764 | A | 4/2016 |
| JP | 2016103576 | A | 6/2016 |
| JP | 2017078141 | A | 4/2017 |
| JP | 2017165791 | A | 9/2017 |
| JP | 2017210518 | A | 11/2017 |
| JP | 2018009089 | A | 1/2018 |
| JP | 2018012809 | A | 1/2018 |
| WO | 2007001039 | A1 | 1/2007 |
| WO | 2015083839 | A1 | 6/2015 |
| WO | 2016038836 | A1 | 3/2016 |
| WO | 2017183800 | A1 | 10/2017 |

OTHER PUBLICATIONS

English translation of International Search Report for PCT/JP2020/019725 dated Aug. 11, 2020, 3 pages.

Machine assisted English translation of JP2010018662A obtained from https://patents.google.com/patent on Nov. 19, 2021, 9 pages.

Machine assisted English translation of JP2011184625A obtained from https://patents.google.com/patent on Nov. 19, 2021, 11 pages.

Machine assisted English translation of JP2012167253A obtained from https://patents.google.com/patent on Nov. 19, 2021, 9 pages.

Machine assisted English translation of JP2015129213A obtained from https://patents.google.com/patent on Nov. 19, 2021, 9 pages.

Machine assisted English translation of JP2016049764A obtained from https://patents.google.com/patent on Nov. 19, 2021, 12 pages.

Machine assisted English translation of WO2015083839A1 obtained from https://patents.google.com/patent on Nov. 19, 2021, 9 pages.

Machine assisted English translation of JP2016103576A obtained from https://patents.google.com/patent on Nov. 22, 2021, 12 pages.

Machine assisted English translation of JP2018009089A obtained from https://patents.google.com/patent on Nov. 22, 2021, 12 pages.

Machine assisted English translation of JP2018012809A obtained from https://patents.google.com/patent on Nov. 22, 2021, 8 pages.

Machine assisted English translation of WO2016038836A1 obtained from https://patents.google.com/patent on Nov. 22, 2021, 20 pages.

* cited by examiner

【FIG. 1】
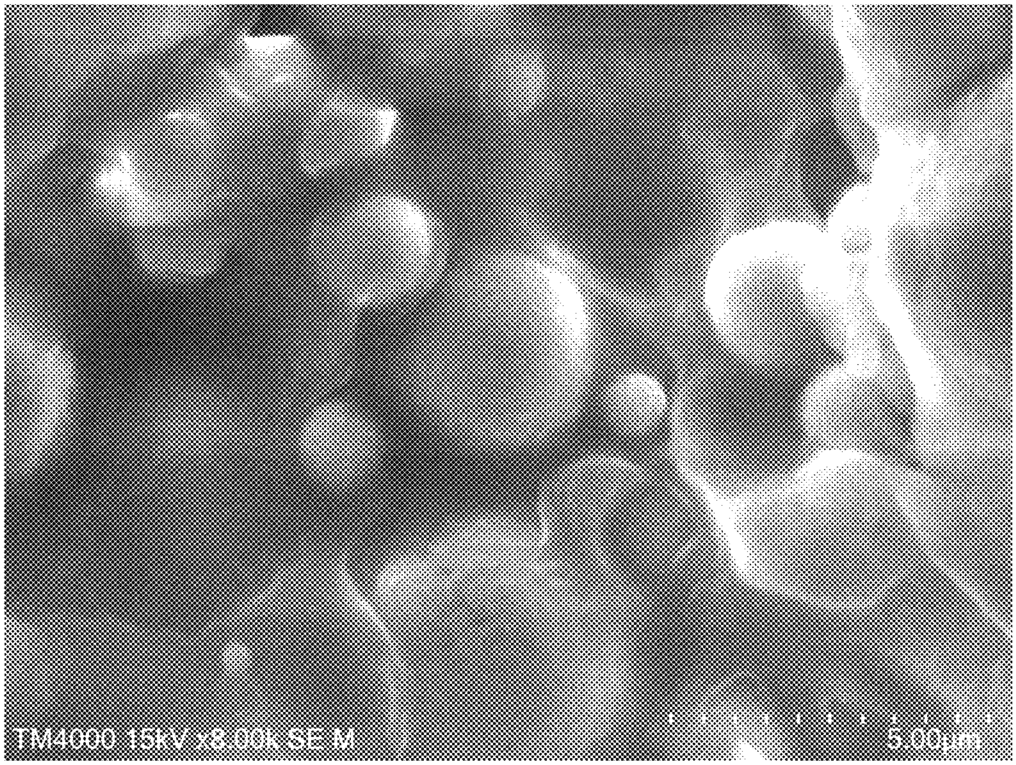
【FIG. 2】
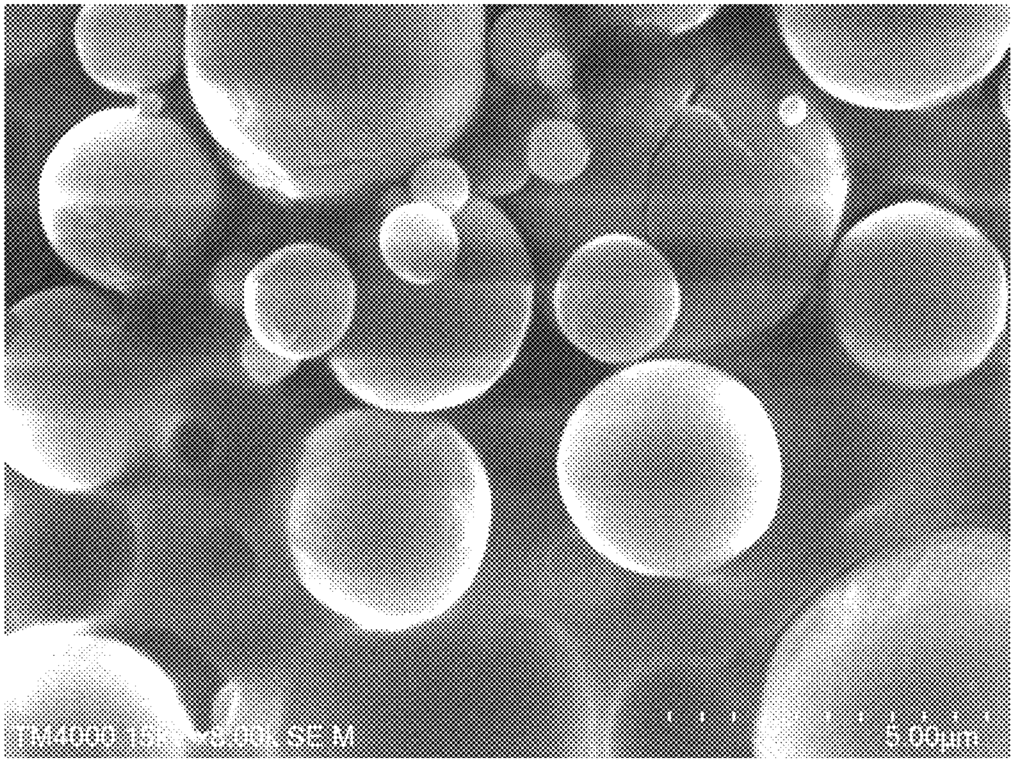

CURABLE ORGANOPOLYSILOXANE COMPOSITION, AND OPTICAL MEMBER FORMED FROM CURED PRODUCT OF SAME

CROSS-REFERENCE TO RELATED APPLICATIONS

This application is the National Stage of International Appl. No. PCT/JP2020/019725 filed on 19 May 2020, which claims priority to and all advantages of Japanese Appl. No. 2019-102545 filed on 31 May 2019, the content of which is hereby incorporated by reference.

TECHNICAL FIELD

The present invention relates to a curable organopolysiloxane composition containing: an organopolysiloxane having a reactive group in which the ratio of aryl groups included in an entire organic group bonded to a silicon atom in a molecule is 0 mol % or more and less than 10 mol %; one or more types of inorganic fillers; and one or more types of compounds selected from a group consisting of organosilicon compounds having a functional group capable of reacting with a reactive group provided by an organopolysiloxane, a hydrolyzable silyl group and/or an SiOH group, and having two or more silicon atoms per molecule, and organosilicon compounds having a reactive functional group with 3 or more carbon atoms capable of reacting with a reactive group provided by an organopolysiloxane, a hydrolyzable silyl group and/or silicon atom-bonded hydroxyl groups, and having one or more silicon atoms in a molecule, where the amount of inorganic fillers is 30 to 95 mass % of the entire composition; relates to a material obtained by curing the curable organopolysiloxane composition, and particularly a material exhibiting light diffusivity; and relates to an optical member containing the material.

BACKGROUND ART

Light-diffusing resin compositions are known to be used in order to set light from a light source uniform and eliminate light unevenness in lighting, an LCD backlight, or the like, or in order to improve illumination by increasing the diffuse reflectance of light. A composition using silicone as a matrix component is known to be used as a light-diffusing resin composition. Silicone resin compositions are known to be used for optical members including such light-diffusing resin compositions. For example, Japanese Unexamined Patent Application 2010-18662 describes the use of a silicone resin composition that contains silica and is curable by a hydrosilylation reaction in an optical waveguide plate. Japanese Unexamined Patent Application 2011-184625 describes, as a light-diffusing resin composition, a light-diffusing dimethyl silicone rubber composition containing dimethylpolysiloxane, fine silica powder or other inorganic filler, and silicone elastic particles containing a phenyl group-containing siloxane unit. Furthermore, Japanese Unexamined Patent Application 2012-167253 describes a light-diffusing dimethyl silicone rubber composition containing a cross-linkable dimethyl silicone rubber, an inorganic filler, and, if desired, a dispersant (wetter). Furthermore, Japanese Unexamined Patent Application 2015-129213 describes: an addition-curing silicone rubber composition containing an alkenyl group-containing straight chain polyorganosiloxane, an alkenyl group-containing MT, MQ or MTQ resin, a polyorganohydrogen siloxane, and a hydrosilylation catalyst, and containing 0.1 to 10 parts by mass of spherical silica having an average particle diameter of 0.2 to 10 μm with regard to 100 parts by mass of the composition; and a light-diffusing silicone rubber obtained from the composition. Furthermore, Japanese Unexamined Patent Application 2016-49764 describes an optical semiconductor element encapsulating composition containing a hydrosilylated curing silicone composition having a phenyl group, a phosphor, and light-diffusing organic particles selected from cross-linked polymethyl methacrylate particles, cross-linked polystyrene particles, and the like.

PRIOR ART DOCUMENTS

Patent Documents

Patent Document 1: Japanese Unexamined Patent Application No. 2010-18662

Patent Document 2: Japanese Unexamined Patent Application No. 2011-184625

Patent Document 3: Japanese Unexamined Patent Application No. 2012-167253

Patent Document 4: Japanese Unexamined Patent Application No. 2015-129213

Patent Document 5: Japanese Unexamined Patent Application No. 2016-49764

SUMMARY OF THE INVENTION

Problems to be Solved by the Invention

However, novel light-diffusing materials with excellent light transmittance, light diffusivity, and mechanical properties are still in demand. In addition to these properties, there is also a need for light-diffusing materials that are highly durable in a reflow type soldering process. An object of the present invention is to provide a curable organopolysiloxane composition capable of obtaining a cured product that can be used as a light diffusing material having an excellent balance of these properties. Furthermore, an object of the present invention is to provide a curable organopolysiloxane composition that can be used in a wide range of optical members, including materials for use in encapsulants to increase the light extraction efficiency from light emitting devices such as light emitting diodes (LEDs) and the like.

Means for Solving the Problems

The curable organopolysiloxane composition of the present invention contains the following components A to C:

A) an organopolysiloxane having at least two radical reactive groups and/or reactive groups that can be cross-linked by a hydrosilylation reaction in a molecule, and where 0 to less than 10 mol % of organic groups bonded to silicon atoms in the molecule (silicon atom-bound organic groups) are aryl groups;

B) one or more types of inorganic fillers; and

C) an organosilicon compound that is different from component A, which is at one or more types of compounds selected from a group consisting of:

C1) an organosilicon compound that is different from component A, having a reactive functional group that can bond with the reactive group of component A, a hydrolyzable silyl group and/or a silicon atom-bonded hydroxyl group in a molecule, and having two or more silicon atoms in the molecule, and C2) an organosilicon compound that is different from component A, having a reactive functional group with 3 or more carbon atoms, which can bond with the reactive group of component A, a hydrolyzable silyl group and/or a silicon atom-bonded hydroxyl group in a molecule, and having one or more silicon atoms in the molecule; where the mass of component B with regard to the mass of the entire composition is 30 to 95%. "0 to less than 10 mol %" of the amount of the aryl group refers to when the aryl group is 0 mol %, in other words, when no aryl group is present, or when an aryl group is present and the amount is less than 10 mol %. Herein, organic groups bonded to silicon atoms (silicon atom-bound organic groups) refer to organic groups such as radical reactive groups, hydrosilylation reactive groups, other monovalent hydrocarbon groups, alkoxy groups bonded to silicon atoms included in the polyorganosiloxane. Note that although component A) may contain a very small amount of a hydroxyl group bonded to a silicon atom or a hydrogen atom bonded to a silicon atom, an effect of the hydroxyl group or the hydrogen atom on the silicon atom is insignificant. Therefore, the amount of an aryl group required to achieve a technical effect of the present invention can be specified in consideration of only the ratio (content rate) of the aryl group to the organic group bonded to silicon in component A).

In the aforementioned composition,

Component A is preferably one or more types of organopolysiloxanes selected from a group consisting of the following component A1 and component A2:

A1) a straight chain or branched chain organopolysiloxane having at least two radical reactive groups and/or reactive groups that can be cross-linked by a hydrosilylation reaction in a molecule, and where 0 mol % or more and less than 10 mol % of silicon atom-bound organic groups are aryl groups in the molecule;

A2) an organopolysiloxane containing:

i) a resin structural block having an $R^1SiO_{3/2}$ unit (where $R^1$ represents a group consisting of monovalent organic groups, hydroxyl groups, and alkoxy groups having 1 to 6 carbons), and optionally, in some cases, further having an $SiO_{4/2}$ unit; and (ii) a straight chain or branched organopolysiloxane structural block containing a straight chain organopolysiloxane structural portion as expressed by $R^2{}_2SiO_{2/2})_n$ (where $R^2$ independently represents an alkyl group having 1 to 20 carbons that may be substituted with a halogen atom or a substituted or unsubstituted aryl group having 6 to 14 carbons, and n represents a number within a range of 3 to 1000);

where at least a portion of $R^1$ and $R^2$ are reactive groups that can be cross-linked by a radical reaction and/or a hydrosilylation reaction, and the ratio of the aryl groups with 6 to 14 carbons included in the total number of mols of the $R^1$ and $R^2$ groups (but excluding the hydroxyl group) is 0 to less than 10 mols, and preferably 0 to 5 mol %.

In the aforementioned composition, the inorganic filler B is preferably one or more types selected from a group consisting of spherical silica particles, spherical alumina particles, and fluorescent fillers.

The spherical silica particles are more preferably spherical fused silica particles and the spherical alumina particles are more preferably spherical fused alumina particles.

In a preferred aspect of the composition, component C is an organosilicon compound as expressed by $$(R^aR^b{}_2SiO)_p—K—(SiR^b{}_2—Y—Si(R^b)_1(OR^c)_{3-q})_r$$

(Where $R^a$ represents a reactive group that can be bonded to a reactive group of component A; $R^b$ independently represents a group selected from a group consisting of monovalent hydrocarbon groups, halogenated hydrocarbon groups, and cyanoalkyl groups; $R^c$ independently represents a group selected from a group consisting of a hydrogen atom, alkyl groups having 1 to 10 carbons, and alkoxyalkyl groups having 2 to 10 carbons in total; K represents a straight chain or branched organopolysiloxane chain or silicone resin structural block, as expressed by average compositional formula $(R^b{}_3SiO_{1/2})_s(R^b{}_2SiO_{2/2})_t(R^bSiO_{3/2})_u(SiO_{4/2})_v(OR^c)_w$ (where $R^b$ and $R^c$ are as defined above, and s, t, u, v, and w represent a number of each unit, each representing a number from 0 to 500, provided that all of t, u, and v are not 0. However, the value of s+w is less than u+2v); Y represents an oxygen atom, a divalent hydrocarbon group, or a group as expressed by general formula:

[Formula 1]

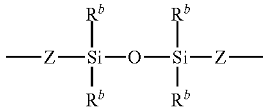

(where $R^b$ is as defined above, and Z is a divalent hydrocarbon group); and to the extent possible depending on the structure of K, p represents a number between 1 to 10, r represents a number between 1 to 10, and q represents a number between 0 to 2).

Component C is more preferably an organosilicon compound as expressed by the following structural formula:

[Formula 2]

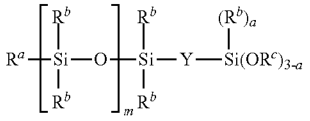

{where $R^a$ represents a reactive group that can be bonded to the reactive group of component A; $R^b$ represents a group selected from a group consisting of monovalent hydrocarbon groups, halogenated hydrocarbon groups, and cyanoalkyl groups; $R^c$ represents a group selected from a group consisting of a hydrogen atom, alkyl groups having 1 to 10 carbons, and alkoxyalkyl groups having 2 to 10 carbons in total; m is a number within a range of 0 to 500, a is 0, 1, or 2, and Y is an oxygen atom, a divalent hydrocarbon group, or a group as expressed by general formula:

[Formula 3]

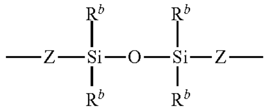

(where $R^b$ is as defined above, and Z is a divalent hydrocarbon group)}.

The present invention further provides a cured product obtained from any of the curable organopolysiloxane compositions described above.

The cured product of the present invention preferably has a light transmittance of 40% or more.

The cured product of the present invention is measured using a white light source (a white LED using a combination of a blue LED and a yellow phosphor), and in a bi-directional transmittance distribution function, preferably has light diffusivity in which the transmitted light intensity at a light receiving position inclined at 45 degrees to the axis of the direct transmitted light about the measurement sample is 0.65 or more, when the intensity of direct transmitted light thereof is set to 1.

Furthermore, the cured product of the present invention preferably has a breaking elongation of 30% or more.

The present invention also provides an optical member containing the cured product of the curable organopolysiloxane composition.

The optical member of the present invention is preferably a light-diffusing coating film material for a light-receiving type sensor having a thickness of 500 μm or less.

Furthermore, the optical member is preferably an encapsulant for a light emitting diode or an organic light emitting device.

The present invention also provides an optical device containing the optical member described above.

Furthermore, the present invention provides a coating agent containing the curable organopolysiloxane composition described above and an organic solvent. The coating agent can be used to form a light diffusion layer on a base material.

Effects of the Invention

A curable organopolysiloxane composition of the present invention has an excellent balance of light transmittance, light diffusion characteristics, and mechanical characteristics, and can exhibit favorable breaking elongation in terms of mechanical properties. Furthermore, a cured product obtained from the curable organopolysiloxane composition of the present invention is molecular designed with a low amount of aryl groups bonded to a silicon atom. Therefore, properties are provided such as higher flexibility in the cured product and larger breaking elongation than an organopolysiloxane composition with a large amount of aryl groups, and followability with regard to deformation of a base material is superior. A base material provided with a coating layer containing the cured product has an advantage where warping or deformation are less likely to occur. The cured product obtained from the curable composition of the present invention is suitable as a material used as an optical member, particularly an optical member for an optical device, and is, for example, suitably used as an encapsulant for a light emitting diode and an organic light emitting device, or a light diffusing material such as a light diffusion film for a light receiving sensor or a light diffusing coating agent.

BRIEF DESCRIPTION OF THE DRAWINGS

FIG. 1 is an SEM photograph showing a fractured surface of a sample of Example 5.

FIG. 2 is an SEM photograph showing a fractured surface of a sample of Comparative Example 3.

MODE FOR CARRYING OUT THE INVENTION

The present invention will be further described in detail hereinafter.

The curable organopolysiloxane composition of the present invention contains the aforementioned component A, component B, and component C as essential components. Components A, B, and C will each be described below. Note that unless otherwise specified, the term "groups per molecule" as used in the present specification refers to the average number per molecule.

<Component A>

Component A has at least two radical reactive groups and/or hydrosilylation reactive groups in a molecule, and may be one type of organopolysiloxane where 0 to less than 10 mol %, and particularly preferably 0 to 5 mol % of an organic group bonded to a silicon atom (silicon atom-bonded organic group) in a molecule is an aryl group, and particularly preferably a phenyl group, or may be a combination of two or more types of organopolysiloxanes. Examples of organopolysiloxanes that can be used as component A include the following.

(Aa) an organopolysiloxane having two or more of one or more types of radical reactive groups in a molecule;

(Ab) an organopolysiloxane having one or more types of groups having two or more hydrosilylation reactive carbon-carbon double bonds in a molecule; and (Ac) an organopolysiloxane having two or more hydrosilylation reactive silicon-bonded hydrogen atoms (SiH) in the molecule.

Furthermore, Aa to Ac may optionally further contain a condensation reactive group in addition to the aforementioned reactive groups. Herein, the condensation reactive group refers to a group capable of forming an Si—O—Si bond by a condensation reaction, and in some cases, hydrolysis and a condensation reaction.

One or two or more types of these Aa to Ac can be used in combination such that organopolysiloxanes are cross-linked together by a radical reaction to produce a cured product, organopolysiloxanes are cross-linked together by a hydrosilylation reaction to produce a cured product, or organopolysiloxanes are cross-linked together by combining the radical reaction and hydrosilylation reaction to produce a cured product.

For example, in order to obtain a composition that is cured by the radical reaction, one or more types of Aa is preferably used as component A. Furthermore, in order to obtain a composition that is cured by the hydrosilylation reaction, Ab and Ac are preferably used in combination as component A. In order to obtain a composition that is cured by combining the radical reaction and hydrosilylation reaction, a combination containing one or more types of Aa, Ab, and Ac can be used as component A, or if a carbon-carbon double bond provided by component Ab is radically reactive, a combination of one or more types of Ab and Ac can be used.

Examples of mutually different organopolysiloxanes in each of the aforementioned components Aa to Ac include: organopolysiloxanes in which bonding positions of reactive groups with regard to an organopolysiloxane skeleton and/or the amount of reactive groups are different, although the organopolysiloxanes are identical from the perspective of having the same reactive groups; and organopolysiloxanes in which the organopolysiloxane skeletons themselves are different from each other.

[Component Aa]

Component Aa is an organopolysiloxane having two or more of one or more types of radical reactive groups in a molecule. The radical reactive groups provided by component Aa are functional groups that can cross-link with each other by a free radical mechanism in the presence of a thermal or photo-radical initiator and/or in the presence of a crosslinking agent, if desired, under irradiation with a high energy beam, such as UV light or electron beams. Examples of radical reactive groups include groups containing a carbon-carbon secondary bond, and more specific examples include alkenyl groups, acrylate and methacrylate groups, and other unsaturated carboxylate groups, and the like. The radical reactive group provided by component Aa may be one type or a combination of two or more types. When two or more types of radical reactive groups are used in combination, one molecule may have two or more types of radical reactive groups, or two or more different organopolysiloxanes, each having a different radical reactive group, can be used in combination.

Component Aa may optionally have a condensation reactive group in addition to the radical reactive group. The condensation reactive group is not particularly limited to a group that can form a Si—O—Si bond by a condensation reaction, and an example includes a condensation reactive group selected from hydroxyl groups and alkoxy groups.

Preferably, component Aa may be an organopolysiloxane expressed by the following average composition formula:

$$R^{11}_{a1}R^{12}_{b1}SiO_{(4-a1-b1)/2} \quad (1)$$

or a mixture of two or more types thereof.

In the formula, $R^{11}$ is a radical reactive group, and preferably a radical reactive group containing a carbon-carbon double bond.

$R^{12}$ is a group selected from substituted or unsubstituted monovalent hydrocarbon groups having no radical-reactive carbon-carbon double bond, hydroxyl groups, and alkoxy groups, provided, however, that at least a portion of $R^{12}$ may be a substituted or unsubstituted aryl group, and that the ratio of aryl groups is 0 to less than 10 mol %, and preferably 0 to 5 mol %, of the total number of mols of $R^{11}$ and $R^{12}$ (but excluding the hydroxyl group). In particular, there is an advantage whereas the amount of the aryl groups decreases, the more the turbidity and the like of a cured product in the range can be suppressed. The alkoxy group is preferably an alkoxy group having 1 to 6 carbon atoms.

a1 and b1 are numbers satisfying the following conditions: $1 \le a1+b1 \le 3$ and $0.001 \le a1/(a1+b1) \le 0.33$. Furthermore, a1 and b1 are preferably numbers satisfying the following conditions: $1.5 \le a1+b1 \le 2.5$ and $0.005 \le a1/(a1+b1) \le 0.2$. This is because when a1+b1 is set above the lower limit of the aforementioned range, the flexibility of a resulting cured product can be increased, while when a1+b1 is set below the upper limit of the aforementioned range, the mechanical strength of a resulting cured product can be increased. Furthermore, this is because when a1/(a1+b1) is set above the lower limit of the aforementioned range, the mechanical strength of a cured product can be increased, while when a1/(a1+b1) is set below the upper limit of the aforementioned range, the flexibility of a resulting cured product can be increased.

In the aforementioned average compositional formula (1), examples of the radical reactive group as represented by $R^{11}$ include groups selected from: vinyl groups, allyl groups, butenyl groups, pentenyl groups, hexenyl groups, heptenyl groups, octenyl groups, nonenyl groups, decenyl groups, undecenyl groups, dodecenyl groups, and other alkenyl groups with 2 to 20 carbons; 3-acryloxypropyl groups, 4-acryloxibutyl groups, and other acryl-containing groups; 3-methacryloxypropyl groups, 4-methacryloxybutyl groups, and other methacryl-containing groups. In the aforementioned average compositional formula, examples of monovalent hydrocarbon groups having no radical reactive carbon-carbon double bonds as represented by $R^{12}$ include: methyl groups, ethyl groups, propyl groups, butyl groups, pentyl groups, hexyl groups, heptyl groups, octyl groups, nonyl groups, decyl groups, undecyl groups, dodecyl groups, and other alkyl groups; phenyl groups, tolyl groups, xylyl groups, naphthyl groups, anthracenyl groups, phenanthryl groups, pyrenyl groups, and other aryl groups; and benzyl groups, phenethyl groups, naphthylethyl groups, naphthylpropyl groups, anthracenylethyl groups, phenanthrylethyl groups, pyrenylethyl groups, and other aralkyl groups. These alkyl groups may have some of their hydrogen atoms substituted with halogen atoms or hydroxyl groups. These aryl and aralkyl groups may also be groups in which one or more of their hydrogen atoms are substituted with an alkyl group such as a methyl group or an ethyl group; an alkoxy group such as a methoxy group or an ethoxy group; and/or a halogen atom such as a chlorine atom, or a bromine atom.

Preferred examples of the radical reactive group $R^{11}$ provided by component Aa include groups selected from vinyl groups, allyl groups, hexenyl groups, acryl-containing groups, and methacryl-containing groups. The monovalent hydrocarbon group provided by component Aa is particularly preferably a group selected from methyl groups and phenyl groups, which is an aryl group.

The aforementioned component Aa can be an organopolysiloxane having a cyclic molecular structure containing only a D unit, or a straight chain molecular structure containing only a D unit or containing a D unit and M unit. Alternatively, component Aa may be an organopolysiloxane having a branched molecular structure or a resinous (network (mesh)) molecular structure, and examples of branched chain or resinous organopolysiloxanes include MQ types, MT types, MQT types, QT types, MDQ types, MDT types, and MDQT types. The component Aa is not limited thereto. Herein, M is a unit as expressed by general formula $RSiO_{1/2}$, D is a unit as expressed by general formula $R_2SiO_{2/2}$, T is a unit as expressed by general formula $RSiO_{3/2}$, and Q is a unit as expressed by a $SiO_{4/2}$ (where R is generally an organic group), and M, D, T, and Q units are terms well known in the technical field of silicones.

The organopolysiloxane as expressed by the aforementioned average compositional formula is a radical reactive organopolysiloxane having a radical reactive group, but can be condensation reactive in addition to being radical reactive when a hydroxyl group and/or alkoxy group is provided as $R^{12}$ in the average compositional formula.

In one particularly preferable aspect, component Aa contains (Aa-1) a straight chain or branched chain organopolysiloxane having a radical reactive group only at an end of a molecular chain, and optionally, in some cases, (Aa-2) an organopolysiloxane resin containing a radical reactive group having at least one branched siloxane unit in a molecule with the amount of radical reactive groups within a range of 0.01 to 7.00 mass %.

Component (Aa-1) is a straight chain organopolysiloxane only containing siloxane units, where a siloxane unit as expressed by $$(Rad)R^{21}_2SiO_{1/2}$$

(where Rad represents a radical reactive group and corresponds to $R^{11}$ of the aforementioned average compositional formula (1), and $R^{21}$ corresponds to $R^{12}$ of the average compositional formula (1)) is provided on an end of the molecular chain thereof, and another siloxane unit is substantially expressed by $R^{22}{}_2SiO_{2/2}$, or a branched chain organopolysiloxane further containing one or more of a T unit and/or a Q unit.

$R^{22}$ has the same meaning as $R^{12}$ in the average compositional formula (1) described above. Furthermore, the degree of siloxane polymerization of component (Aa-1) is within a range of 7 to 1002 including terminal siloxane units. Such a component (Aa-1) is particularly preferably a straight chain organopolysiloxane where both ends of the molecular chain are blocked with a siloxane unit expressed by (Rad) $R^{21}{}_2SiO_{1/2}$.

Component (Aa-2) is an organopolysiloxane resin containing a radical reactive group, and examples include radical reactive group-containing organopolysiloxane resins as expressed by the following average unit formula:

$$(R^{31}SiO_{3/2})_{o1}(R^{31}{}_2SiO_{2/2})_{p1}(R^{31}{}_3SiO_{1/2})_{q1}(SiO_{4/2})_{r1}(XO_{1/2})_{s1} \quad (2).$$

In the average unit formula (2) above, $R^{31}$ independently represents a group consisting of the radical reactive groups represented by $R^{11}$ in the average compositional formula (1) of component A described above, and the substituted or unsubstituted monovalent hydrocarbon groups having no radical reactive carbon-carbon double bond, hydroxyl groups, and alkoxy groups represented by $R^{12}$. The alkoxy group is preferably an alkoxy group having 1 to 6 carbon atoms. Furthermore, X is a hydrogen atom or an alkyl group having 1 to 3 carbon atoms. However, of all $R^{31}$, in a range where the amount of the radical reactive groups in the organopolysiloxane resin is at least within a range of 0.01 to 7.00 mass %, and preferably a range of 0.05 to 6.00 mass %, $R^{31}$ is a radical reactive group, and in particular, at least a portion of $R^{31}$ on the siloxane unit as expressed by $R^{31}{}_3SiO_{1/2}$ is preferably a radical reactive group.

Furthermore, in formula (2), (o1+r1) is a positive integer, p1 is 0 or a positive integer, q1 is 0 or a positive integer, s1 is 0 or a positive integer, p1/(o1+r1) is a number within a range of 0 to 10, q1/(o1+r1) is a number within a range of 0 to 5, (o1+r1)/(o1+p1+q1+r1) is a number within a range of 0.3 to 0.9, and s1/(o1+p1+q1+r1) is a number within a range of 0 to 0.4.

Particularly preferable examples of component (Aa-2) include radical reactive group-containing MQ organopolysiloxane resins as expressed by the following average unit formula:

$$(Rad)R^{31}{}_2SiO_{1/2})_{q11}(R^{31}{}_3SiO_{1/2})_{q21}(SiO_{4/2})_{r11} \quad (3)$$

(where Rad represents a radical reactive group and has the same meaning as $R^{11}$ in the aforementioned average compositional formula (1), $R^{31}$ has the same meaning as $R^{12}$ in the aforementioned average compositional formula (1), and q11+q21+r1 is a number within a range of 50 to 500, (q11+q21)/r11 is a number within a range of 0.1 to 2.0, and q11 is a number within a range where the amount of radical reactive groups in the organopolysiloxane resin is within a range of 0.01 to 7.00 mass %, and preferably 0.05 to 6.00 mass %).

By combining component (Aa-1) having only a radical reactive group on an end of a molecular chain and component (Aa-2), which is an organopolysiloxane resin and has a certain amount of radical reactive groups, a cured product having excellent fast curing/fast drying properties as a whole composition and excellent mechanical strength and flexibility can be obtained.

[Component Ab]

Component Ab is an organopolysiloxane having two or more groups having one or more types of hydrosilylation reactive carbon-carbon double bonds in a molecule, and in which 0 mol % to less than 10 mol % of silicon atom-bonded organic groups in the molecule are aryl groups, and preferably phenyl groups. The hydrosilylation reactive group provided by component Ab is any group that can react with the SiH group to form a C—Si bond by reacting with an SiH group, and is not limited to any particular group. As described below, examples include a monovalent hydrocarbon group containing a carbon-carbon double bond, and more specific examples included alkenyl groups, and particularly alkenyl groups having a carbon-carbon double bond at an end. The hydrosilylation reactive group provided by component Ab may be one type or a combination of two or more types. When two or more types of hydrosilylation reactive groups are used in combination, one molecule may have two or more types of hydrosilylation reactive groups, or two or more different organopolysiloxanes, each having a different hydrosilylation reactive group, can be used in combination.

Component Ab may optionally have a condensation reactive group in addition to the hydrosilylation reactive group. The condensation reactive group is not particularly limited to a group that can form a Si—O—Si bond by a condensation reaction, and an example includes a condensation reactive group selected from hydroxyl groups and alkoxy groups. The alkoxy group is preferably an alkoxy group having 1 to 6 carbon atoms.

Preferably, component Ab may be an organopolysiloxane expressed by the following average composition formula:

$$R^{41}{}_{a4}R^{42}{}_{b4}SiO_{(4-a4-b4)/2} \quad (4)$$

or a mixture of two or more types thereof.

In the formula, $R^{41}$ is a hydrosilylation reactive group, and preferably a monovalent hydrocarbon group, and preferably an alkenyl group having a carbon-carbon double bond.

$R^{42}$ is a group selected from substituted or unsubstituted monovalent hydrocarbon groups other than a hydrosilylation reactive group, hydroxyl groups, and alkoxy groups, provided, however, that at least a portion of $R^{42}$ may be a substituted or unsubstituted aryl group, and that the ratio of aryl groups is 0 to less than 10 mol %, and preferably 0 to 5 mol %, of the total number of mols of $R^{41}$ and $R^{42}$ (but excluding the hydroxyl group). a4 and b4 are numbers satisfying the following conditions: $1 \le a4+b4 \le 3$ and $0.001 \le a4/(a4+b4) \le 0.33$. Furthermore, a4 and b4 are preferably numbers satisfying the following conditions: $1.5 \le a4+b4 \le 2.5$ and $0.005 \le a4/(a4+b4) \le 0.2$. This is because when a4+b4 is set above the lower limit of the aforementioned range, the flexibility of a resulting cured product can be increased, while when a4+b4 is set below the upper limit of the aforementioned range, the mechanical strength of a resulting cured product can be increased. Furthermore, this is because when a4/(a4+b4) is set above the lower limit of the aforementioned range, the mechanical strength of a cured product can be increased, while when a4/(a4+b4) is set below the upper limit of the aforementioned range, the flexibility of a resulting cured product can be increased.

Examples of the hydrosilylation reactive group as represented by $R^{41}$ in the aforementioned average compositional formula (4) include vinyl groups, allyl groups, butenyl groups, pentenyl groups, hexenyl groups, heptenyl groups, octenyl groups, nonenyl groups, decenyl groups, undecenyl groups, dodecenyl groups, and other alkenyl groups having 2 to 20 carbon atoms. In particular, $R^{41}$ is preferably independently a group selected from vinyl groups, allyl groups, and hexenyl groups, is particularly preferably a vinyl group. In the aforementioned average compositional formula, examples of monovalent hydrocarbon groups other than the hydrosilylation reactive group as represented by $R^{42}$ include: methyl groups, ethyl groups, propyl groups, butyl groups, pentyl groups, hexyl groups, heptyl groups, octyl groups, nonyl groups, decyl groups, undecyl groups, dodecyl groups, and other alkyl groups; phenyl groups, tolyl groups, xylyl groups, naphthyl groups, anthracenyl groups, phenanthryl groups, pyrenyl groups, and other aryl groups; and benzyl groups, phenethyl groups, naphthylethyl groups, naphthylpropyl groups, anthracenylethyl groups, phenanthrylethyl groups, pyrenylethyl groups, and other aralkyl groups. These alkyl groups may have some of their hydrogen atoms substituted with halogen atoms or hydroxyl groups. These aryl and aralkyl groups may also be groups in which one or more of their hydrogen atoms are substituted with an alkyl group such as a methyl group or an ethyl group; an alkoxy group such as a methoxy group or an ethoxy group; and/or a halogen atom such as a chlorine atom, or a bromine atom.

The hydrosilylation reactive group $R^{41}$ provided by component Ab is preferably a group selected from vinyl groups, allyl groups, and hexenyl groups, and is particularly preferably a vinyl group. The monovalent hydrocarbon group other than a hydrosilylation reactive group, provided by component Ab is particularly preferably a group selected from phenyl groups serving as an aryl group and methyl groups.

The aforementioned component Ab can be an organopolysiloxane having a cyclic molecular structure containing only a D unit, or a straight chain molecular structure containing only a D unit or containing a D unit and M unit. Alternatively, component Ab may be an organopolysiloxane having a branched molecular structure or a resinous (network) molecular structure, and examples of branched chain or resinous organopolysiloxanes include MQ types, MT types, MQT types, QT types, MDQ types, MDT types, and MDQT types. The component Aa is not limited thereto.

The organopolysiloxane as expressed by the aforementioned average compositional formula (4) is a hydrosilylation reactive organopolysiloxane having a hydrosilylation reactive group, but can be condensation reactive in addition to being hydrosilylation reactive when a hydroxyl group and/or alkoxy group is provided as $R^{42}$ in the average compositional formula. The alkoxy group is preferably an alkoxy group having 1 to 6 carbon atoms.

In one particularly preferable aspect, component Ab contains (Ab-1) a straight chain or branched chain organopolysiloxane having an alkenyl group only at an end of a molecular chain, and optionally, in some cases, (Ab-2) an organopolysiloxane resin containing an alkenyl group having at least one branched siloxane unit in a molecule with the amount of vinyl ($CH_2{=}CH{-}$) groups within a range of 0.01 to 7.00 mass %.

Component (Ab-1) is a straight chain organopolysiloxane only containing siloxane units, where a siloxane unit as expressed by $$(Alk)R^{42}{}_2SiO_{1/2}$$

(where Alk represents an alkenyl group with two or more carbon atoms and corresponds to $R^{41}$ of the aforementioned average compositional formula (4), and $R^{42}$ corresponds to $R^{42}$ of the average compositional formula (4)) is provided on an end of the molecular chain thereof, and another siloxane unit is substantially expressed by $R^{42}{}_2SiO_{2/2}$, or a branched chain organopolysiloxane further containing one or more of a T and/or Q unit. Furthermore, the degree of siloxane polymerization of component (Ab-1) is within a range of 7 to 1002 including terminal siloxane units. Such a component (Ab-1) is particularly preferably a straight chain organopolysiloxane in which both ends of the molecular chain are blocked with a siloxane unit represented by (Alk) $R^{42}{}_2SiO_{1/2}$.

Component (Ab-2) is an organopolysiloxane resin containing an alkenyl group, and an example thereof includes an organopolysiloxane resin containing an alkenyl group expressed by the following formula average unit formula:

$$(R^{51}SiO_{3/2})_{o2}(R^{51}{}_2SiO_{2/2})_{p2}(R^{51}{}_3SiO_{1/2})_{q2}(SiO_{4/2})_{r2}(XO_{1/2})_{s2} \quad (5).$$

In the average unit formula (5) above, $R^{51}$ is independently a group selected from alkenyl groups, which are a hydrosilylation reactive group, monovalent hydrocarbon groups other than a hydrosilylation reactive group, hydroxyl groups, and alkoxy groups, specified as groups represented by $R^{41}$ and $R^{42}$ in the average compositional formula (4) of component Ab described above, and X is a hydrogen atom or an alkyl group with 1 to 3 carbon atoms. The alkoxy group is preferably an alkoxy group having 1 to 6 carbon atoms. However, of all $R^{51}$, $R^{51}$ is an alkenyl group at least within a range in which the amount of vinyl ($CH_2{=}CH{-}$) groups in the organopolysiloxane resin satisfies a range of 0.01 to 7.00 mass %, and preferably 0.05 to 6.00 mass %, and at least a portion of $R^{51}$ in the siloxane unit expressed by $R^{51}{}_3SiO_{1/2}$ is particularly preferably alkenyl groups.

In formula 5, (o2+r2) is a positive integer, p2 is 0 or a positive integer, q2 is 0 or a positive integer, s2 is 0 or a positive integer, p2/(o2+r2) is a number within a range of 0 to 10, q2/(o2+r2) is a number within a range of 0 to 5, (o2+r2)/(o2+p2+q2+r2) is a number within a range of 0.3 to 0.9, and s2/(o2+p2+q2+r2) is a number within a range of 0 to 0.4.

The component (Ab-2) is in particular preferably a alkenyl group-containing MQ organopolysiloxane resin represented by:

$$((Alk)R^{51}{}_2SiO_{1/2})_{q21}(R^{51}{}_3SiO_{1/2})_{q22}(SiO_{4/2})_{r2} \quad (6)$$

(In the formula, Alk is an alkenyl group having two or more carbon atoms, $R^{51}$ is a group other than the hydrosilylation reactive group specified in the above average formula (5), q21+q22+r2 is a number in the range of 50 to 500, (q21+q22)/r2 is a number in the range of 0.1 to 2.0, and q21 is a number in the range where the vinyl group ($CH_2{=}CH{-}$) content in the organopolysiloxane resin satisfies a range of 0.01 to 7.00 mass %, preferably 0.05 to 6.00 mass %).

By combining the component (Ab-1) having alkenyl groups only at the molecular chain terminals thereof and the component (Ab-2), which is an organopolysiloxane resin and has a certain amount of alkenyl groups, a cured reactant having superior fast curing/fast drying properties as a whole composition and excellent mechanical strength and flexibility can be obtained.

[Preferred Forms of Components Aa and/or Ab]

The components Aa and/or Ab in this case are:

(i) $R^{61}SiO_{3/2}$ units (wherein $R^{61}$ independently represents a group consisting of a radical reactive group, a hydrosilylation reactive group, a monovalent organic group other than a radical reactive group and a hydrosilylation reactive group, a hydroxyl group, and an alkoxy group having 1 to 6 carbons), and optionally a resin structural block that may in some cases additionally have $SiO_{4/2}$ units, and (ii) An organopolysiloxane containing a straight chain or branched organopolysiloxane including a straight chain represented by $(R^{62}{}_2SiO_{2/2})_n$ (in which $R^{62}$ independently represents a radical reactive group, a hydrosilylation reactive group, an alkyl group having 1 to 20 carbons which may be substituted with a halogen atom, and a group selected from substituted or unsubstituted aryl groups having 6 to 14 carbons, and n represents a number in the range of 3 to 1,000, preferably 20 to 300), wherein at least a part of $R^{61}$ and $R^{62}$ is a radical reactive group and/or a hydrosilylation reactive group, and wherein the proportion of aryl groups having 6 to 14 carbon atoms of the total number of moles of $R^{61}$ and $R^{62}$ groups (but excluding hydroxyl groups and hydrogen atoms) is 0 to less than 10 mol %, and preferably 0 to 5.0 mol %. This manner of structure having a resin structural block and a straight chain or branched block containing a straight chain structural portion (linear structural block) is referred to herein as a resin linear structure.

The radical reactive groups that $R^{61}$ and $R^{62}$ may represent include groups independently selected from those described as the radical reactive groups that $R^{11}$ of the average composition formula (1) may represent in the description of component Aa above. As the radical reactive group represented by $R^{61}$ and $R^{62}$, a group selected from a vinyl group, an allyl group, a hexenyl group, an acrylic-containing group, and a methacrylate-containing group is preferable, and in particular, a vinyl group, an allyl group, and a hexenyl group is preferable.

The hydrosilylation reactive groups that $R^{61}$ and $R^{62}$ may represent are groups independently selected from those described as the hydrosilylation reactive groups represented by $R^{41}$ in the average composition formula (4) of the component Ab described above. The hydrosilylation reactive group represented by $R^{61}$ and $R^{62}$ is preferably a group selected from a vinyl group, an allyl group, and a hexenyl group, and a vinyl group is preferable.

A monovalent organic group other than the radical reactive group and the hydrosilylation reactive group that $R^{61}$ can represent can be a substituted or unsubstituted monovalent hydrocarbon group having no carbon-carbon double bond that has limited radical reaction and hydrosilylation reactivity. Examples of substituted or unsubstituted monovalent hydrocarbon groups include: alkyl groups such as methyl, ethyl, propyl, butyl, pentyl, hexyl, heptyl, octyl, nonyl, decyl, undecyl, and dodecyl groups and the like; aryl groups such as phenyl, tolyl, xylyl, naphthyl, anthracenyl, phenanthryl, pyrenyl, and the like; and aralkyl groups such as benzyl, phenethyl, naphthylethyl, naphthylpropyl, anthracenylethyl, phenanthrylethyl, pyrenylethyl, and the like. These alkyl groups may have some of their hydrogen atoms substituted with halogen atoms or hydroxyl groups. These aryl and aralkyl groups may also be groups in which one or more of their hydrogen atoms are substituted with an alkyl group such as a methyl group or an ethyl group; an alkoxy group such as a methoxy group or an ethoxy group; and/or a halogen atom such as a fluorine atom, a chlorine atom, or a bromine atom.

The alkoxy groups having 1 to 6 carbon atoms that $R^{61}$ may represent include straight chain, branched, and cyclic alkoxy groups such as methoxy, ethoxy, n-propoxy, isopropoxy, butoxy, pentyloxy, hexyloxy, and cyclohexyloxy. As the alkoxy group, the methoxy group is particularly preferred.

Examples of an alkyl group having 1 to 20 carbons that may be substituted with a halogen atom, which $R^{62}$ may represent, include a non-substituted alkyl group such as a methyl group, an ethyl group, a propyl group, a butyl group, a pentyl group, a hexyl group, a heptyl group, an octyl group, a nonyl group, a decyl group, an undecyl group, or a dodecyl group, and alkyl groups in which one or more of the hydrogen atoms of the alkyl group is substituted with a halogen atom, such as a fluorine, chlorine, or bromine atom. As an alkyl group, a methyl group is particularly preferable. Examples of a group selected from a substituted or unsubstituted aryl group having 6 to 14 carbons that $R^{62}$ can represent include a phenyl group, a tolyl group, a xylyl group, a naphthyl group, an anthracenyl group, a phenanthryl group, and a pyrenyl group, and a group in which some or all of the hydrogen atoms bonded to these groups are replaced with a halogen atom such as a fluorine atom, a chlorine atom, or a bromine atom. As an aryl group, a phenyl group is particularly preferable.

The straight chain or branched organopolysiloxane structural block containing the straight chain diorganopolysiloxane structural portion of ii) above can comprise only a straight chain diorganopolysiloxane represented by $(R^{62}_2SiO_{2/2})_n$, or can have a branched organopolysiloxane structure in which this straight chain diorganopolysiloxane is bonded to a T unit ($R^{62}SiO_{3/2}$) and/or a Q unit, preferably to a T unit.

This component can have a structure formed by combining the organopolysiloxane resin structural block of i) above and the straight chain or branched organopolysiloxane block of ii) above, wherein the linkage portion between the resin structural block and the straight chain or branched organopolysiloxane structural block is selected from a group including a —Si—O—Si— bond, —Si—$R^A$—Si— (wherein $R^A$ is a carbon number of 2 to 14, preferably representing 2 to 10 straight chain or branched alkylene groups), and combinations thereof. The formation of —Si—O—Si— bonds between the structural blocks of i) and structural blocks of ii) is not particularly limited. For example, the resin structural block of i) and the straight chain or branched block of ii) can be cross-linked by a condensation reaction between their respective Si—OH and/or Si—OR groups (wherein OR is a hydrolyzable group such as alkoxy having 1-6 carbon atoms). Therefore, in this case, for example, as a method of synthesizing the resin linear structure, the resin structural block of i) is formed first, and then the straight chain or branched organopolysiloxane block is synthesized under conditions in which the straight chain or branched organopolysiloxane block is linked to a SiOH and/or SiOR group of a resin structural block. For example, a product of the desired structure can be obtained by ring-opening polymerization of a cyclic organopolysiloxane in the presence of a resin structural block having SiOH and/or SiOR groups, optionally in the presence of a further crosslinking agent. The synthesis reaction itself of such organopolysiloxane can be carried out using well-known methods.

When the linkage portion of the resin structural block and the straight chain or branched organopolysiloxane structural block containing a straight chain portion is a —Si—$R^A$—Si— group (wherein $R^A$ represents a straight chain or branched alkylene group having a carbon number of 2 to 14, preferably 2 to 10), for example, when the hydrosilylation reaction is carried out by reacting a straight chain or branched diorganopolysiloxane block having a silicon bonded hydrogen atom (SiH group) with a resin structural block having a hydrosilylation reactive alkenyl group, an organopolysiloxane having a resin linear structure in which the alkenyl group of the resin structural block is the $R^A$ portion is obtained. Synthesis of the organopolysiloxane having a resin linear structure can be carried out in accordance with the method disclosed in JP 2010-1336, for example.

However, the methods for synthesizing organopolysiloxanes having a resin linear structure including the structures of i) and ii) above are not limited to the methods described above.

Although an organopolysiloxane having a resin linear structure may be used in the present invention, a straight chain or branched chain organopolysiloxane is suitably used.

In component A, the ratio of aryl groups to the groups bonded to the Si atoms of the siloxane units in the straight chain or branched chain organopolysiloxane is 0 to less than 10 mol %, preferably 0 to 5 mol %, so that the cured product obtained from the curable organopolysiloxane composition of the present invention has high flexibility and excellent breaking elongation. Moreover, when component A is combined with components B and C, a cured product with superior light diffusivity and a good balance of mechanical properties can be obtained. In addition, the low content of aryl groups has the advantage of suppressing turbidity of the cured product.

[Component Ac]

Component Ac is an organohydrogenpolysiloxane having, on average, two or more silicon-bonded hydrogen atoms (SiH) that are hydrosilylation reactive in the molecule. This component Ac is used in combination with an organopolysiloxane (component Ab) having, on average, two or more groups per molecule that are hydrosilylation reactive with SiH groups to obtain a hydrosilylation reaction curable composition. Component Ac is a component that functions as a cross-linking agent for component Ab.

Specific examples of component Ac include: 1,1,3-3-tetramethyldisiloxane, 1,3,5,7-tetramethyl cyclotetrasiloxane, tris(dimethylhydrogensiloxy)methylsilane, tris(dimethylhydrogensiloxy)phenylsilane, methylhydrogenpolysiloxanes blocked at both ends of a molecular chain with a trimethylsiloxy group, dimethylsiloxane/methylhydrogensiloxane copolymers blocked at both ends of a molecular chain with a trimethylsiloxy group, dimethylpolysiloxane blocked at both ends of a molecular chain with a dimethylhydrogensiloxane group, dimethylsiloxane/methylhydrogensiloxane copolymers blocked at both ends of a molecular chain with a dimethylhydrogensiloxane group, methylhydrogensiloxane/diphenylsiloxane copolymers blocked at both ends of a molecular chain with a trimethylsiloxy group, methylhydrogensiloxane/diphenylsiloxane/dimethylsiloxane copolymers blocked at both ends of a molecular chain with a trimethylsiloxy group, hydrolytic condensates of a trimethylsilane, copolymers containing $(CH_3)_2HSiO_{1/2}$ units and $SiO_{4/2}$ units, copolymers containing $(CH_3)_2HSiO_{1/2}$ units, $SiO_{4/2}$ units, and $(C_6H_5)SiO_{3/2}$ units, and mixtures of two or more types thereof.

In the curable composition of the present invention, the component Ac in particular includes:

(Ac-1) a straight chain or branched chain organohydrogenpolysiloxane having silicon-bonded hydrogen atoms at only the molecular chain terminals, and optionally, (A-c2) a straight chain or resinous organohydrogenpolysiloxane having at least three silicon-bonded hydrogen atoms in a molecule.

Component (Ac-1) is an organohydrogenpolysiloxane having a silicon-bonded hydrogen atom at a molecular chain terminal that is a component that functions as a chain length extender in a hydrosilylation reaction with component (Ab) and improves flexibility of the cured reactant. This manner of component (Ac-1) is suitably a straight chain organohydrogenpolysiloxane, and for example, those represented by the following structural formulas can be suitably used.

$HMe_2SiO(Ph_2SiO)_{m1}SiMe_2H$ $HMe_2SiO(Me_2SiO)_{m1}SiMe_2H$ $HMePhSiO(Ph_2SiO)_{m1}SiMePhH$ $HMePhSiO(Me_2SiO)_{m1}SiMePhH$ $HMePhSiO(Ph_2SiO)_{m1}(MePhSiO)_{n1}SiMePhH$ $HMePhSiO(Ph_2SiO)_{m1}(Me_2SiO)_{n1}SiMePhH$

In the formulae, Me and Ph represent a methyl group and a phenyl group, respectively, m1 represents an integer from 1 to 100, and n1 represents an integer from 1 to 50.

Component (Ac-2) is a straight chain or resinous organohydrogenpolysiloxane having at least three silicon-bonded hydrogen atoms in the molecule, and is a component which, when used in combination with component (Ac-1) described above, can impart rapid curability to the composition.

Examples of a straight chain organohydrogenpolysiloxane include: methylhydrogenpolysiloxane capped at both molecular terminals with trimethylsiloxy groups, copolymers of dimethylsiloxane and methyl hydrogen siloxane capped at both molecular terminals with trimethylsiloxy groups, copolymers of dimethylsiloxane and methyl hydrogen siloxane copolymer capped at both molecular terminals with dimethylhydrogensiloxy groups, copolymers of methylhydrogensiloxane diphenylsiloxane capped at both molecular terminals with trimethylsiloxy groups, and copolymers of methylhydrogensiloxane diphenylsiloxane dimethylsiloxane capped at both molecular terminals with trimethylsiloxy groups.

The resinous organohydrogenpolysiloxane, on the other hand, is an organohydrogenpolysiloxane including at least a branched siloxane unit selected from $SiO_{4/2}$ units (Q units) and $R^3SiO_{3/2}$ units (T units), as well as $R^3{}_3SiO_{1/2}$ units (M units), $R^3{}_2HSiO_{1/2}$ units ($M^H$ units), and for cases when optionally selected, $R^3{}_2SiO_{1/2}$ units (D units), and $R^3HSiO_{1/2}$ units ($D^H$ units), more specifically, Examples include one or more organohydrogenpolysiloxane resins selected from $M^HMQ$ type, $M^HQ$ type, $M^HMT$ type, $M^HT$ type, $M^HMQT$ type, $M^HQT$ type, $M^HMDQ$ type, $M^HMDD^HQ$ type, $M^HDQ$ type, $M^HDD^HQ$ type, $M^HMDT$ type, $M^HMDD^HT$ type, $M^HDT$ type, $M^HDD^HT$ type, $M^HMDQT$ type, $M^HMDD^HQT$ type, $M^HDQT$ type, and $M^HDD^HQT$ type.

In the above formulae, $R^3$ is a methyl group or a phenyl group.

<Component B>

Component B is an inorganic filler that imparts optical functionality, such as light diffusion characteristics or wavelength conversion, to the cured product obtained from the curable composition of the present application. The inorganic filler can be any one of which, when combined with the organopolysiloxane of the present invention, provides the desired optical function such as light diffusivity or wavelength conversion or the like, and is not limited to a specific inorganic filler as long as such an effect can be obtained. One or a combination of two or more types selected from the group consisting of spherical silica particles, spherical alumina particles, and fluorescent filler are preferable as the filler for the curable composition of the present invention. By using the inorganic filler in an amount of 30 to 95% by mass relative to the total mass of the curable organopolysiloxane composition of the present invention, a cured product having well-balanced mechanical properties as well as excellent optical effects can be obtained. The amount of inorganic filler is preferably between 40 and 95 mass %, and particularly preferably between 50 and 92.5 mass %, of the total mass of the composition.

[Spherical Silica Particles]

Silica particle are known to have both irregular and spherical shapes. Although particles of any shape may be used as long as the light diffusion characteristics of the cured material obtained from the curable organopolysiloxane composition of the present invention can be improved, spherical silica particles are preferably used for the curable composition of the present invention. Particularly preferred as the spherical silica particles are spherical fused silica particles spheroidized by a fusing method, for example, spherical fused silica particles spheroidized by melting pulverized fine powder silica in a flame, as well as those that are commercially available can be used. Spherical silica particles, in particular spherical fused silica particles, with an average particle diameter of 1 to 10 μm, in particular 2 to 5 μm ($d_{50}$) measured using the Coulter method or by laser diffraction scattering, are preferably used in the present invention.

[Spherical Alumina Particles]

Although particles of any shape may be used as long as the light diffusion characteristics of the cured material obtained from the curable organopolysiloxane composition of the present invention can be improved, alumina particles used for the present invention are preferably spherical. Particularly preferable spherical alumina particles are, for example, spherical fused alumina particles spheroidized by the fusing method in which pulverized fine powder alumina particles are fused in a flame to form spheres, and commercially available materials can be used. Spherical alumina particles, in particular spherical fused alumina particles, with an average particle diameter of 1 to 10 μm, in particular 2 to 5 μm ($d_{50}$) measured using the Coulter method or by laser diffraction scattering, are preferably used in the present invention.

[Fluorescent Filler]

A fluorescent filler (phosphor) is also preferably used as the inorganic filler used as component B in the present invention. The film or sheet or coating layer containing the fluorescent filler, obtained from the curable composition of the present invention, also functions as a wavelength conversion material, and when arranged on a light source, can convert the wavelength of light from the light source. The fluorescent filler can also be used to impart light diffusion characteristics. There is no particular limitations to this phosphor, with examples thereof including yellow, red, green, and blue light emitting phosphors, included in oxide phosphors, oxynitride phosphors, nitride phosphors, sulfide phosphors, oxysulfide phosphors, and the like, that are widely used in light emitting diodes (LED) and organic light emitting device (OLED). Examples of the oxide phosphors include: yttrium, aluminum, and garnet-type YAG green to yellow light phosphors containing cerium ions; terbium, aluminum, and garnet-type TAG yellow light phosphors containing cerium ions; and silicate green to yellow light phosphors containing cerium or europium ions. In addition, exemplary oxynitride phosphors include silicon, aluminum, oxygen, and nitrogen type SiAlON red to green light phosphors containing europium ions. Exemplary nitride phosphors include calcium, strontium, aluminum, silicon, and nitrogen type CASN red light phosphors containing europium ions. Exemplary sulfide phosphors include ZnS green light phosphors containing copper ions or aluminum ions. Exemplary oxysulfide phosphors include $Y_2O_2S$ red light phosphors containing europium ions. One or a combination of two or more of these phosphors can be used in the curable organopolysiloxane composition of the present invention. Commercially available phosphors can also be used.

[Component C]

Component C is an organosilicon compound that is different from component A, with one or more types of compounds selected from a group consisting of C1 and C2 below:

C1) an organosilicon compound that is different from component A, having a reactive functional group that can bond with the reactive group of component A, a hydrolyzable silyl group and/or a silicon atom-bonded hydroxyl group in a molecule, and having two or more silicon atoms in the molecule, and C2) an organosilicon compound that is different from component A, having a reactive functional group with 3 or more carbon atoms, which can bond with the reactive group of component A, a hydrolyzable silyl group and/or a silicon atom-bonded hydroxyl group in a molecule, and having one or more silicon atoms in the molecule.

By combining component A and component B with component C, the breaking elongation can be significantly improved without reducing the fracture strength of the cured product obtained from the curable composition of the present invention. In addition, as a result of the improved breaking elongation, high-temperature durability of the cured product, especially thermal shock resistance, is improved, and this provides the advantage that deformation, cracking, and peeling from a member of the cured product due to severe temperature changes (heat shock) can be prevented.

Component C is preferably an organosilicon compound represented by the following formula (7):

$$(R^aR^b{}_2SiO)_p—K—(SiR^b{}_2—Y—Si(R^b)_q(OR^c)_{3-q})_r \quad (7)$$

This compound is an example of the C1 compound described above, and also an example of the C2 compound described above when $R^a$ is a radical reactive group or a hydrosilylation reactive group containing 3 or more carbon atoms.

In the formula (7) $R^a$ is a reactive group that bonds with a radical reactive group or hydrosilylation reactive group including component A.

When component A has a radical reactive group, $R^a$ is also preferably a radical reactive group that can react with that radical reactive group. Examples of $R^a$ include an alkenyl group having 2 to 20 carbon atoms, such as a vinyl group, an allyl group, a butenyl group, a pentenyl group, a hexenyl group, a heptenyl group, an octenyl group, a nonenyl group, a decenyl group, an undecenyl group, a dodecenyl group, and the like; acrylic-containing groups such as 3-acryloxypropyl and 4-acryloxybutyl groups; and methacryl-containing groups such as a 3-methacryloxypropyl group or a 4-methacryloxybutyl group. Furthermore, in the case that the radical reactive group included in component A is an alkenyl group, an acrylic-containing group, or a methacryl-containing group, an example of the reactive group including in component C is a mercapto group. When component A has a hydrosilylation reactive group, $R^a$ may also be a group that can form a bond with the hydrosilylation reactive group included in component A. Examples include a group selected from alkenyl groups having 2 to 20 carbons such as a vinyl group, an allyl group, a butenyl group, a pentenyl group, a hexenyl group, a heptenyl group, an octenyl group, a nonenyl group, a decenyl group, an undecenyl group, and a dodecenyl group, preferably a vinyl group, or a silicon bonded hydrogen atom.

$R^b$ independently represents a group selected from the group including a monovalent hydrocarbon group, a halogenated hydrocarbon group, and a cyanoalkyl group.

Examples of $R^b$ include alkyl groups having 1 to 10 carbon atoms such as a methyl group, an ethyl group, a propyl group, a butyl group, or an octyl group; cycloalkyl groups such as a cyclopentyl group or a cyclohexyl group; substituted or unsubstituted aryl groups such as a phenyl group, a tolyl group, or a naphthyl group; aralkyl groups such as a benzyl group, a phenylethyl group, or a phenylpropyl group; halogenated hydrocarbon groups such as a trifluoropropyl group or a chloropropyl group; and cyanoalkyl groups such as a β-cyanoethyl group or a γ-cyano-propyl group. $R^b$ is preferably an independent methyl group or a phenyl group, and a methyl group is particularly preferable.

$R^c$ is independently a group selected from a collection including a hydrogen atom, an alkyl group having 1 to 10 carbon atoms, and an alkoxyalkyl group having 2 to 10 carbon atoms in total. Examples of alkyl groups include a methyl group, an ethyl group, a propyl group, a butyl group, a hexyl group, and an octyl group. Examples of alkoxyalkyl groups include a methoxymethyl group, a methoxyethyl group, and an ethoxyethyl group. $R^c$ is preferably an independent hydrogen atom, a methyl group, or an ethyl group.

In Formula (7), K represents an organosilane block or straight chain or branched organopolysiloxane block, represented by the average composition formula $$(R^b{}_3SiO_{1/2})_s(R^b{}_2SiO_{2/2})_t(R^bSiO_{3/2})_u(SiO_{4/2})_v(OR^c)_w.$$

In the formula, $R^b$ and $R^c$ are as defined for formula (7). s, t, u, v, and w each represent the number of each unit, and each represents a number from 0 to 500, provided that all of t, u, and v are not 0. However, the value of s+w is less than or equal to u+2v), representing a straight chain or branched organopolysiloxane chain or a silicone resin structural block.

In Formula (7), Y is an oxygen atom, a divalent hydrocarbon group, or group represented by the general formula:

[Formula 4]

(8)

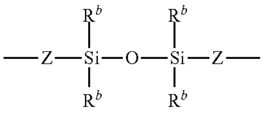

(where in the formula, $R^b$ is as defined above and Z is a divalent hydrocarbon group). The divalent hydrocarbon group represented by Z is preferably independently an alkylene group having 1 to 10 carbon atoms, and is particularly preferably selected from a methylene group, an ethylene group, a propylene group, a butylene group, and a hexylene group.

In Formula (7), p represents a number from 1 to 10, r represents a number from 1 to 10, and q represents a number from 0 to 2, to the extent possible depending on the structure of K.

In one aspect, there is no K in formula (7), in other words, K represents a single bond, and p and r may be 1. In this case, the compound of formula (7) is represented by the following formula:

$$R^aR^b{}_2SiO—SiR^b{}_2—Y—Si(R^b)_q(OR^c)_{3-q} \quad (9).$$

In Formula (9), $R^a$, $R^b$, $R^c$, Y, and q are as defined for Formula (7).

The compound of formula (7) described above is in particular preferably an organosilicon compound represented by the following structural formula:

[Formula 5]

(10)

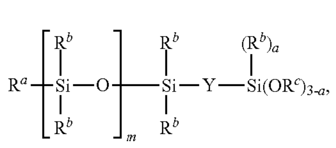

In Formula (10), $R^a$, $R^b$, $R^c$, and Y, are as defined for Formula (7). $R^a$ is in particular preferably a vinyl group or a hydrogen atom. $R^b$ is preferably an alkyl group having 1 to 10 carbon atoms, such as a methyl group, an ethyl group, a propyl group, a butyl group, or an octyl group, and methyl group is particularly preferable.

In Formula (10), m is a number in the range of 0 to 500, and m is particularly preferably a number at which the viscosity of this compound at 25° C. is 20 to 1,000,000 mPa-s. If the compound of formula (10) is a compound having a different molecular structure, for example, a mixture of two or more compounds having different average values of m, the value of m should be such that the viscosity of the mixture is the viscosity described above.

In the formula (10), Y is as defined for formula (7). a is 0, 1, or 2, and a is preferably 0 or 1, and 0 is particularly preferable.

Particularly preferred compounds of formula (10) are those represented by the following chemical formula: $Vi(CH_3)_2Si—(OSi(CH_3)_2)_n—OSi(OCH_3)_3$, where Vi represents vinyl and n is 1 to 50, preferably 2 to 30, and more preferably 3 to 25.

The organosilicon compound represented by Formula (7) or (10) can be manufactured in accordance with a well-known method, for example, a manufacturing method described in JP H04-13767 A or JP S63-270762 A.

Note, the organosilicon compound should have a low content of low molecular weight siloxane oligomers (octamethylterrasiloxane (D4), decamethylpentasiloxane (D5)) or should be substantially free of these.

An example of a particularly preferred compound among the compounds represented by Formula (7) or (10) is an organosilicon compound represented by the following formula.

$$R^a(Me)_2Si—(OSiMe_2)_n—Si(OMe)_3 \quad (11)$$

In formula (11), $R^a$ is a radical-reactive or hydrosilylation reactive functional group, Me is a methyl group, and n is a number from 1 to 100, preferably from 2 to 50, and particularly preferably from 3 to 30. When the compound of formula (11) is a mixture of compounds with a different value n, n represents an average value.

Also, in formula (11), $R^a$ is particularly preferably a vinyl group or a hydrogen atom, where the vinyl group is a radical reactive and/or hydrosilylation reactive group and the hydrogen atom is a hydrosilylation reactive group.

Examples of the compounds of C2 described above are compounds in which the carbon number of the $R^a$ group having radical reactivity and/or hydrosilylation reactivity is 3 or more in each of the organosilicon compounds described above and compounds represented by the following general formula: $R^a(R^b)_qSi(OR^c)_{3-q}$ (7').

In Formula (7'), $R^a$ represents a reactive functional group having a carbon number of 3 or more that can be combined with a reactive group possessed by component A, and $R^b$, $R^c$, and q have the meanings defined for Formula (7). In Formula (7'), $R^a$ is preferably a terminal unsaturated alkenyl group having 3 or more carbons, for example, allyl and hexenyl. $R^b$ is preferably a group selected from methyl and phenyl groups, with methyl groups being particularly preferable. $R^c$ is preferably a group selected from methyl and ethyl groups, with methyl groups being particularly preferable. q is particularly preferable to be 0. Specific compounds represented by Formula (7') include, but are not limited to, allyltrimethoxysilane, allyltriethoxysilane, hexenyltrimethoxysilane, hexenyltriethoxysilane, methacrylpropyltrimethoxysilane, methacrylpropyltriethoxysilane acrylopropyltrimethoxysilane, acrylopropyltriethoxysilane, and the like, but are not limited thereto.

Although components C1 and C2 described above can be used as component C of the present invention, component C1 in particular is usually a non-volatile component, enabling stable surface treatment to be performed on component B, and the technical effects of the present invention can be achieved in a more stable manner with use of a small amount as compared to use of a volatile component C. Components C1 and C2 preferably have a boiling point of 200° C. or higher at 25° C. and 1 atm and are substantially non-volatile.

[Curing Accelerator]

The curable organopolysiloxane composition of the present invention contains components A, B, and C as essential components as described above, and a curing accelerator or a curing catalyst may be added to the composition to promote the curing reaction involving components A and C. The curable composition of the present invention may be cured by heat, including at room temperature, by using high energy rays such as ultraviolet rays, or by a combination thereof.

[Radical Polymerization Initiator]

When component A has a radical reactive functional group, a radical polymerization initiator may be added to the composition as a radical reaction initiator to promote curing of the curable composition. A known thermal radical polymerization initiator such as an azo compound or an organic peroxide can be used as a radical polymerization initiator. Examples of organic peroxides include: alkyl peroxides and/or acyl peroxides, such as benzoyl peroxide, 2,4-dichlorobenzoyl peroxide, p-chlorobenzoyl peroxide, dicumylperoxide, ditert-butylperoxide, 2,5-dimethyl-2,5-di(tert-butylperoxy)hexane, and the like, but not limited thereto. Examples of azo compounds include: 2,2'-azobisisobutyronitrile, 2,2'-azobis-2-methylbutyronitrile, 2,2'-azobis-2,4-dimethylvaleronitrile, 4,4-azobis-4-cyanovaleric acid, and the like, but not limited thereto. The amount of thermal radical polymerization initiator that is used is preferably equal to or more than, and preferably two times or more than, the number of moles of the radical reactive groups of component A in the curable organopolysiloxane composition of the present invention. When a thermal radical polymerization initiator is used, the composition may be heated in order to cure the curable composition.

A photoradical polymerization initiator may be used together with or in place of the thermal radical polymerization initiator. A known initiator can be used as a photoradical polymerization initiator, without limitation in particular. Specific examples of photoradical polymerization initiators include: acetophenone, benzophenone, o-benzoylbenzoic acid, p-benzoylbenzoic acid, 2,2-diethoxyacetophenone, 2,4-diethyl-9H-thioxanthen-9-one, 4,4'-dimethoxybenzyl, 2,2-dimethoxy-2-phenylacetophenone, 2-ethoxy-2-phenylacetophenone, 2-ethylanthraquinone, 1-hydroxycyclohexylphenylketone, 2-(hydroxyimino)propiophenone, 2-hydroxy-2-methylpropiophenone, 2-isopropoxy-2-phenylacetophenone, 2-methyl-4'-(methylthio)-2-morpholinopropiophenone, p,p'-tetramethyldiaminobenzophenone, and the like, but not limited thereto. Omnirad 651, 184, 1173, 2959, 127, 907, 369, 369E, and 379EG (alkylphenone photoinitiators, IGM Resins B. V.), Omnirad TPO H, TPO-L, and 819 (acyl phosphine oxide photoinitiators, IGM Resins B.V.), Omnirad MBF and 754 (intramolecular hydrogen extraction type photoinitiators, IGM Resins B.V.), Irgacure OXE01 and OXE02 (oxime ester photoinitiators, BASF) and the like may be used. When a photoradical polymerization initiator is used, the curable composition may be irradiated with high energy rays, such as ultraviolet rays, X-rays, or an electron beam. If the radical reactive groups of component A generate sufficient crosslinking reaction by only irradiation of high energy rays, the curable composition of the present invention may be cured only by irradiation of high energy rays without using a photoradical initiator. When a photoradical polymerization initiator is used, a photosensitizer may be used in addition thereto. The use of a sensitizer can increase the photon efficiency of the polymerization reaction, and is particularly effective when the coating thickness of the composition is relatively thick or when a relatively long-wavelength LED light source is used for light irradiation, because use of longer wavelength light for the polymerization reaction compared to only using a photoinitiator is feasible. Examples of photosensitizers include: anthracene compounds, phenothiazine compounds, perylene compounds, cyanine compounds, merocyanine compounds, coumarin compounds, benzylidene ketone compounds, (thio)xanthene or (thio)xanthone compounds, such as isopropylthioxanthone, 2,4-diethylthioxanthone, squalium-based compounds, (thia)pyrillium-based compounds, porphyrin-based compounds, and the like. Any photosensitizer, including but not limited to these, can be used in the curable composition of the present invention.

The amount of the photoradical polymerization initiator added to the composition of the present invention is not particularly limited as long as the desired photoradical polymerization reaction occurs, but is generally used in an amount of 0.01 to 5% by mass, preferably 0.05 to 1% by mass, relative to the total mass of the curable composition of the present invention.

A photosensitizer can also be used in combination with the photocationic polymerization initiator or photoradical polymerization initiator. Examples of photosensitizers include: anthracene compounds, phenothiazine compounds, perylene compounds, cyanine compounds, merocyanine compounds, coumarin compounds, benzylidene ketone compounds, (thio)xanthene or (thio)xanthone compounds, such as isopropylthioxanthone, 2,4-diethylthioxanthone, squalium-based compounds, (thia)pyrillium-based compounds, porphyrin-based compounds, and the like.

If component A has a radical reactive group, component C has a group that is reactive with that radical reactive group. The reactive group of component C preferably reacts with the radical reactive group of component A under conditions in which component A undergoes a radical polymerization reaction.

[Hydrosilylation Reaction Catalyst]

When component A or components A and C have a hydrosilylation reactive functional group, a hydrosilylation reaction catalyst may be added to the composition of the present invention to facilitate curing of the composition. In the curable composition of the present invention, (i) a hydrosilylation reaction catalyst that exhibits activity in the composition without irradiating with a high energy beam;

(ii) a hydrosilylation reaction catalyst that does not exhibit activity without irradiating with a high energy beam, but exhibits activity in a composition by irradiating with a high energy beam; or (iii) combinations of (i) and (ii)

can be used. When curing the curable composition of the present invention at room temperature or by heating, catalyst (i) is used, and when curing of the curable composition is further promoted by irradiation with a high energy beam, catalyst (ii) is preferably used in addition to catalyst (i). When the curable composition of the present invention is cured by irradiation with a high energy beam, the catalyst (ii) can be used. When the catalysts (i) and (ii) are used in combination, the amount of the catalyst (i) and the catalyst (ii) added to the curable composition by mass ratio is preferably in the range of 100/0 to 5/95 (catalyst (i)/catalyst (ii)).

High energy beams include ultraviolet rays, X-rays, and electron beams, among which ultraviolet light is preferable because catalytic activity efficiency is high. Furthermore, when irradiating with a high energy beam, the amount of irradiation varies depending on the type of high energy beam activated hydrosilylation reaction catalyst, but in the case of ultraviolet rays, the cumulative amount of irradiation at a wavelength of 365 nm is preferably within a range of 100 $mJ/cm^2$ to 10 $J/cm^2$.

The catalyst (i) described above is a hydrosilylation catalyst that exhibits hydrosilylation reaction activity without irradiating with high energy beams. By using the catalyst (i), the curable composition of the present invention can be provided with a fast curing/fast drying cure profile when the hydrosilylation reaction inhibitor is not included or the amount of inhibitor is small. Examples of hydrosilylation reaction catalysts of catalyst (i) include: platinum based catalysts, rhodium based catalysts, palladium based catalysts, nickel based catalysts, iridium based catalysts, ruthenium based catalysts, and iron based catalysts. Platinum based catalysts are preferable. Examples of platinum based catalyst include platinum based compounds, such as platinum fine powders, platinum black, platinum-supporting silica fine powders, platinum-supporting activated carbon, chloroplatinic acids, alcohol solutions of chloroplatinic acids, olefin complexes of platinum, alkenylsiloxane complexes of platinum, and the like. Alkenylsiloxane complexes of platinum are particularly preferable. Exemplary alkenylsiloxanes include: 1,3-divinyl-1,1,3,3-tetramethyldisiloxane; 1,3,5,7-tetramethyl-1,3,5,7-tetravinylcyclotetrasiloxane; alkenyl siloxanes obtained by substituting a portion of the methyl groups of the alkenylsiloxanes with an ethyl group, a phenyl group, or the like; and alkenylsiloxanes obtained by substituting a portion of the vinyl groups of these alkenylsiloxanes with an allyl group, a hexenyl group, or the like. The platinum-alkenyl siloxane complex has favorable stability, so 1,3-divinyl-1,1,3,3-tetramethyldisiloxane is particularly preferable. Furthermore, the stability of the platinum-alkenylsiloxane complex can be improved. Therefore, 1,3-divinyl-1,1,3,3-tetramethyldisiloxane, 1,3-diallyl-1,1,3,3-tetramethyldisiloxane, 1,3-divinyl-1,3-dimethyl-1,3-diphenyldisiloxane, 1,3-divinyl-1,1,3,3-tetraphenyldisiloxane, and 1,3,5,7-tetramethyl-1,3,5,7-tetravinylcyclotetrasiloxane, or other alkenylsiloxane or dimethylsiloxane oligomers or other organosiloxane oligomers are preferably added to the complex, with an alkenylsiloxane particularly preferably added to the complex.

Catalyst (i) is a catalyst that is active without irradiating with a high energy beam, preferably a catalyst that is active even at a relatively low temperature. Specifically, the composition exhibits activity in the curable composition of the present invention at a temperature range of 0 to 200° C. to promote hydrosilylation reaction. The content of the catalyst (i) varies depending on the type of catalyst and the type of composition, but is usually an amount in which the metal atoms in the catalyst are within the range of 0.01 to 50 ppm by mass for the curable composition. In particular, an alkenylsiloxane complex of platinum is used and platinum content thereof is adjusted to an amount preferably within the range of 1.5 to 30 ppm so that the property of fast curing/fast drying can be imparted to the curable composition of the present invention. When the amount of the added catalyst (i) is too small, the curing time of the curable composition will increase, and if the amount added is too large, the usable life will be too short, causing inconveniences for practical use, while also raising costs, which is not preferable.

Catalyst (ii) is a hydrosilylation catalyst which is not active without irradiation of a high energy beam, but is active in the present composition with irradiation of a high energy beam, and therefore is called a high energy beam activated catalyst or a photoactivated catalyst.

Specific examples of catalyst (ii) include (methylcyclopentadienyl) trimethyl platinum (IV), (cyclopentadienyl) trimethyl platinum (IV), (1,2,3,4,5-pentamethyl cyclopentadienyl) trimethyl platinum (IV), (cyclopentadienyl) dimethylethyl platinum (IV), (cyclopentadienyl) dimethylacetyl platinum (IV), (trimethylsilyl cyclopentadienyl) trimethyl platinum (IV), (methoxycarbonyl cyclopentadienyl) trimethyl platinum (IV), (dimethylsilyl cyclopentadienyl) trimethylcyclopentadienyl platinum (IV), trimethyl (acetylacetonato) platinum (IV), trimethyl (3,5-heptanedionate) platinum (IV), trimethyl (methylacetoacetate) platinum (IV), bis(2,4-pentanedionato) platinum (II), bis(2,4-hexanedionato) platinum (II), bis(2,4-heptanedionato) platinum (II), bis(3,5-heptanedionato) platinum (II), bis(1-phenyl-1,3-butanedionato) platinum (II), bis(1,3-diphenyl-1,3-propanedionato) platinum (II), and bis(hexafluoroacetylacetonato) platinum (II). Of these, (methylcyclopentadienyl) trimethyl platinum (IV) and bis(2,4-pentanedionato) platinum (II) are preferred from the perspective of versatility and ease of acquisition.

A combination of catalyst (i) and catalyst (ii) can also be used as a catalyst for curing the curable composition of the present invention. For example, the hydrosilylation reactant obtained from the catalyst (i) described above can be imparted secondary curability by irradiation with a high energy beam (hereinafter referred to as "photocurable"), and by irradiating with a high energy beam in the presence of catalyst (i) and (ii). In addition, the curing reaction is promoted by the catalyst (i) even in areas where sufficient light irradiation is not possible, and the reactants cured until they become non-flowable can be further cured. In addition, compared to only using catalyst (i), further fast curing/fast drying properties may be achieved when catalyst (ii) is used in combination. The amount of catalyst (ii) added is the amount required to further cure the composition and achieve the reactant obtained by component (i) above, or the amount sufficient to improve the fast curing/fast drying properties, preferably in an amount that results in the metal atoms in this catalyst being in the range of 1 to 50 ppm by mass for this composition, and preferably in the range of 5 to 30 ppm.

In the compositional design of this manner of curable composition having high energy beam curability, for example, being photocurable, in addition to curability at room temperature, the mass ratio of catalyst (i) to catalyst (ii) should be in the range of 90/10 to 5/95, and a range of 85/15 to 10/90 is more preferable. This is because if the mass ratio is less than the upper limit, increase in curing reaction speed is achieved through high energy beam irradiation. If the mass ratio is less than the lower limit, the curing reaction will not progress sufficiently in a short time at relatively low temperatures such as room temperature, in other words, a fast curing/fast drying profile may not be achieved. After applying the curable composition of the present invention to a base material or the like, the curable composition can be irradiated with ultraviolet light using a spot UV light source to prevent the composition from flowing.

When the curable composition of the present invention is a composition that cures by a hydrosilylation reaction, a hydrosilylation reaction inhibitor may be used as necessary. Hydrosilylation reaction inhibitors are usually used to improve the pot life of the curable composition. Examples of the compounds that can be used as inhibitors of the hydrosilylation reaction in the curable composition of the present invention include: 2-methyl-3-butyn-2-ol, 3,5-dimethyl-1-hexyne-3-ol, 2-phenyl-3-butyn-2-ol and other alkyne alcohols; 3-methyl-3-pentene-1-yn, 3-methyl-3-pentene-1-yn, 3,5-dimethyl-3-hexene-1-yn and other enyne compounds; 1,3,5,7-tetramethyl-1,3 5,7-tetravinylcyclotetrasiloxane, 1,3,5,7-tetramethyl-1,3,5,7-tetrahexenylcyclotetrasiloxane, benzotriazole, and the like. Although the amount of the reaction inhibitor is not limited, it is preferably within the range of 0.0001 to 5 mass parts for a total of 100 mass parts of the curable composition of the present invention.

When component A or components A and C comprising the curable composition of the present invention have a hydrosilylation reactive group, each component is preferably in the range of 0.1 to 10 moles of silicon-bonded hydrogen atoms to 1 mole of a carbon-carbon double bond that is a hydrosilylation reactive group, suitably in the range of 0.2 to 5.0 moles and particularly suitably in the range of 0.5 to 2.0 moles. If the amount of silicon bonded hydrogen atoms is 0.1 mole or less for one mole of hydrosilylation reactive carbon-carbon double bond, the curable composition may not cure sufficiently. If the amount of silicon bonded hydrogen atoms for one mole of hydrosilylation reactive carbon-carbon double bonds is more than 10 moles, the cured product obtained may become too hard or the breaking elongation of the cured product may decrease.

[Condensation Reaction Catalyst]

A condensation reaction catalyst may be added to the curable composition of the present invention to promote the reaction between the hydrolyzable silicon group and/or the silicon atom-bonded hydroxyl group in component C and the inorganic filler of component B. The type of condensation reaction catalyst for use in the present invention is not particularly limited, and examples include: organic tin compounds such as dibutyltin dilaurate, dibutyltin diacetate, tin octenoate, dibutyltin dioctate, and tin laurate and the like; organic titanium compounds such as tetrabutyltitanate, tetrapropyltitanate, and dibutoxybis(ethylacetoacetate)titanium, and the like; other acidic compounds such as hydrochloric acid, sulfuric acid and dodecylbenzene sulfonic acid, and the like; alkaline compounds such as ammonia and sodium hydroxide, and the like; amine compounds such as 1,8-diazabicyclo[5.4.0]undecene (DBU), 1,4-diazabicyclo[2.2.2]octane (DABCO), and the like; organic zirconium esters such as zirconium tetrapropylate and zirconium tetrabutyrate, and the like; organic zirconium chelates such as zirconium tri butoxyacetylacetonate, zirconium butoxyacetylacetonate bisethylacetoacetate, zirconium tetraacetylacetonate, and the like; zirconium-based condensation cocatalysts such as oxozirconium compounds such as zirconium bis(2-ethylhexanoate)oxide and zirconium acetylacetonate (2-ethylhexanoate)oxide, and the like; aluminum alcholates such as aluminum triethylate, aluminum triisopropylate, aluminum tri(sec-butylate), and the like; aluminum chelating compounds such as diisopropoxyaluminum (ethylacetoacetate) aluminum tris (ethylacetoacetate), aluminum tris (acetylacetonate), and the like; aluminum-based condensation auxiliary catalysts such as aluminum acyloxy compounds such as hydroxyaluminum bis(2-ethylhexanoate) and the like, and preferably organic tin compounds and organic titanium compounds. The amount of the condensation reaction catalyst used is not particularly limited, and may be any amount within the range where the purpose of promoting the condensation reaction is achieved. The use of a condensation reaction catalyst is optional and need not be used in this composition.

[Other Additives]

An organopolysiloxane other than component A described above, an inorganic filler other than component B described above, an organic resin fine powder such as polymethacrylate resin, an adhesion imparting agent, a heat resistant agent, dye, pigment, a flame retarder, or solvent or the like can be added to the curable organopolysiloxane composition of the present invention as needed. These additives are known to those skilled in the art, and any method of adding them in any amount may be used to the extent that the purpose of the present invention is not impaired.

As component B, particles selected from the group including spherical silica particles, in particular spherical fused silica particles; spherical alumina particles, in particular spherical fused alumina particles; and fluorescent filler, titanium oxide particles and the like with an average particle diameter of 0.1 to 10.0 μm can be used as the inorganic filler. This manner of additional inorganic fillers can be blended into the curable composition for the purpose of further improving the reflection scattering effect of the cured product obtained by curing the curable composition of the present invention.

[Characteristics of Cured Product Obtained from Curable Composition of the Present Invention]

The cured product obtained by curing the curable organopolysiloxane composition of the present invention preferably has an optical transmittance of 40% or more. Optical transmittance is a value measured for the wavelength range of visible light (full range) on a UV-VIS-NIR spectrophotometer with an integrated unit of 150 mm in diameter. Further, the cured product has a light scattering property measured by using a Scattering Profiler or the like equipped with a white light source (in particular, a white LED by a combination of a blue LED and a yellow phosphor), for measuring a bi-directional transmittance distribution function and in the bi-directional transmittance distribution function, when the direct transmission intensity thereof is set to 1, a light diffusivity where the transmitted light intensity is 0.65 or more at the light receiving position with the direct transmission centered on the measurement sample inclined 45 degrees is preferable. The bi-directional transmittance distribution function (BTDF) is a function specific to the transmission position that represents the level of light components that are transmitted and propagate in each direction.

The cured product obtained from the curable organopolysiloxane composition of the present invention preferably has an breaking elongation in the range of 30% or more. Compared to a curable composition that includes component A but does not use component C, the cured product of the present invention dramatically improves the breaking elongation without significant change to the fracture strength through combining component A and component C.

The hardness of the cured product according to the present invention is preferably in the range of Shore A hardness 30 to Shore D hardness 50. In general, the hardness of the cured product increases as the amount of radical reactive groups or hydrosilylation reactive groups included per unit volume or unit mass of the curable composition of the present invention increases. Therefore, hardness of the cured product can be adjusted by adjusting the amount of reactive groups included in the curable composition. Shore A to Shore D hardness of the cured product can be adjusted using the percentage of component B inorganic filler included in the curable composition The cured product obtained from the curable organopolysiloxane composition of the present invention has high flexibility and excellent elongation breaking elongation, and is therefore preferable as a material for use as a coating agent having light diffusion characteristics.

[Applications of the Cured Product of the Present Invention]

Applications of the curable organopolysiloxane composition of the present invention are not particularly limited. Applications of the composition of the present invention include: adhesives, encapsulants, protective agents, coating agents, underfill agents, and the like for electrical and electronics and in particular the composition can be used for base materials requiring light diffusivity. Particularly preferred applications of the curable composition of the present invention include optical members, particularly optical members requiring light diffusivity. More specific applications include light diffusion films or coatings for light receiving sensors, in particular light diffusion films and light diffusing coating agents for light receiving sensors. Another specific application suitable for the curable composition of the present invention is an encapsulant for light emitting diodes. The present invention also provides an optical device that includes an optical member formed using the curable composition of the present invention such as a light receiving sensor or light emitting diode. Light emitting diodes include both inorganic light emitting diodes (LEDs) and organic light emitting diodes (OLEDs).

When the curable composition of the present invention is used as an optical member of a light emitting diode, especially as an encapsulant, the inorganic filler of component B is in particular preferably a fluorescent filler (phosphor).

In the cured product obtained from the curable organopolysiloxane composition of the present invention, the amount of aryl groups, in particular phenyl groups, of the organopolysiloxane silicon-bonded organic groups is at least 0 to 10 mole % (including 0 mole %), preferably 0 to 5 mole % to provide high flexibility and high breaking elongation. Therefore the cured product is suitable for use as a coating agent, in particular a coating agent for optical members. When the curable composition of the present invention is used as an optical member such as a light diffusion coating, the thickness of the cured product obtained from the curable composition is in general preferably 10 to 500 μm. If the curable organopolysiloxane composition of the present invention has a viscosity suitable for coating on a base material, for example, a peelable base material, the composition can be used as-is without dilution using a solvent. The viscosity of the composition of the present invention can also be diluted with a solvent to achieve a viscosity suitable for coating the composition onto a peelable base material. Accordingly, the present invention provides a coating agent including a curable organopolysiloxane composition as described above and a solvent, in particular an organic solvent. The coating agent can be used to form a coating layer including a cured product of the curable composition of the present invention on a base material. The coating layer thereof is not particularly limited, but can be, for example, a light diffusion layer of an optical member.

The cured product obtained from the curable organopolysiloxane composition of the present invention can be used as a member in a desired form, but when used as an optical member, use in a film or sheet form or in a thin film form is preferable, and especially preferable in a coated thin film form. For example, the curable composition of the present invention can be used to provide a solid silicone material in the form of a cured film or sheet (film includes thin film) or coating film with a thickness in the range of 10 to 500 μm, preferably 20 to 300 μm.

In addition, when the curable organopolysiloxane composition of the present invention is used as a light diffusing material and the inorganic filler of component B, in particular spherical silica particles, especially spherical fused silica particles, and/or in particular spherical alumina particles, especially spherical fused alumina particles, is used, the thickness of the film or sheet or coating layer of the cured product of the present invention is preferably in the range of 3 L to 200 L (μm) with respect to the particle diameter L (μm) of the filler.

Although the hardness of the solid silicone material forming the film or sheet material or the coating layer is not particularly limited and is also dependent on the base material, for practical use, the hardness of the cured product obtained from the curable composition of the present invention is preferably in the range of Shore A hardness 30 to Shore D hardness 50.

[Coating Agents]

The curable organopolysiloxane composition of the present invention can be used as a coating liquid dissolved and suspended in an organic solvent to form a film or sheet cured product or to form a coating film on a base material. As the organic solvent used to prepare the coating solution, the type of the organic solvent is not particularly limited, as long as the solvent is a compound capable of dissolving all or some of the components of components A and C in the composition, and a compound having a boiling point of between 80° C. and 200° C. at 1 atm (0.1013 MPa) is preferably used. Examples of solvents that can be used include: non-halogen solvents such as i-propyl alcohols, t-butyl alcohols, cyclohexanols, cyclohexanones, methyl ethyl ketones, methyl isobutyl ketones, toluenes, xylenes, mesitylenes, 1,4-dioxanes, dibutyl ethers, anisoles, 4-methyl anisoles, ethyl benzenes, ethoxy benzenes, ethylene glycols, ethylene glycol dimethyl ethers, ethylene glycol diethyl ethers, 2-methoxy ethanols (ethylene glycol monomethyl ethers), diethylene glycol dimethyl ethers, diethylene glycol monomethyl ethers, ethyl acetates, butyl acetates, propyl propionates (also called “propyl propionate”), 1-methoxy-2-propyl acetates, 1-ethoxy-2-propyl acetates, octamethyl cyclotetrasiloxanes, and hexamethyl disiloxanes, and halogen solvents such as trifluoromethyl benzenes, 1,2-bis (trifluoromethyl)benzenes, 1,3-bis (trifluoromethyl)benzenes, 1,4-bis (trifluoromethyl)benzenes, trifluoromethyl chlorobenzenes, trifluoromethyl fluorobenzenes, and hydrofluoroethers. The organic solvent can be used independently or as a mixture of two or more types thereof. In particular, i-propyl alcohol, methyl isobutyl ketone, and the like are suitably used.

[Method for Forming a Film, Sheet, or Thin Film of a Curable Organopolysiloxane Composition]

There is no particular restriction on the method of forming the solid silicone material, which is a cured product obtained by curing the curable organopolysiloxane composition of the present invention, into a film, a sheet, or a thin film, but for example, the following method can be used.

(i) Film Formation by Forming Process

If the solid silicone material obtained by curing the curable organopolysiloxane composition of the present invention has hot-melt properties, depositing on a desired base material using a known molding technique such as integral molding can be performed. Typical molding techniques include transfer molding, injection molding, and compression molding. For example, in transfer molding, the solid silicone material of the present invention is filled into the plunger of a molding machine, and automatic molding is performed to obtain a film-like or thin film-like member as a molded product. The molding machine can be an auxiliary ram type molding machine, a slide type molding machine, a double ram type molding machine, or a molding machine for low pressure encapsulation.

By using a peelable base material as the base material, a film or sheet-like cured product containing the solid silicone material of the present invention formed on said base material can also be transferred to another base material for use.

(ii) Film, Sheet, or Thin-Film Coating with Solvent, and Film Formation by Solvent Removal and Curing Since the curable organopolysiloxane composition of the present invention can be uniformly dispersed in an organic solvent such as i-propyl alcohol or methyl isobutyl ketone, a dispersion solution containing the curable organopolysiloxane composition can be coated onto a desired base material in the form of a film or sheet, and then the organic solvent is removed by drying or other means and the curable composition is cured to obtain a film or sheet material. When the dispersion fluid is coated in a film or sheet, the viscosity of the dispersion fluid is preferably adjusted by using a solvent such that the viscosity of the entire dispersion fluid is 100 to 10,000 mPa-s. When diluting the dispersion fluid with a solvent, a solvent in the range of 2,000 mass parts or less of the total amount of solids contained in the dispersion fluid (100 mass parts) is preferably used. Examples of the application method to the substrate include: gravure coating, offset coating, offset gravure, roll coating using an offset transfer roll coater, reverse roll coating, air knife coating, curtain coating using a curtain flow coater or the like, comma coating, meyer bar, spin coating, or other known methods used for the purpose of forming a cured layer may be used without limitation. The amount of the curable composition coated onto the base material can be any amount, but can be coated so that the film or sheet-like material formed after removal of the organic solvent and curing of the curable composition has the desired film thickness. As described below, by using a peelable base material as a base material for coating the dispersion described above, a film or sheet including the solid silicone material of the present invention can be formed on the peelable base material and then separated from the base material to obtain a bulk material in film or sheet form, and the film or sheet-like material can also be transferred from one base material to another base material. The cured organopolysiloxane composition of the present invention can also be dissolved and dispersed in an organic solvent to form a coating film by coating directly on a member of an optical device, removing the solvent, and then curing.

[Laminate Body]

The solid silicone material obtained by curing the curable organopolysiloxane composition of the present invention can be used as an optical member, particularly in optical devices, such as light emitting diodes (LEDs), organic light emitting devices (OLEDs), and light receiving sensors. In this case, the solid silicone material obtained from the curable composition of the present invention is in particular preferably arranged at the interface with the air as a solid layer comprising the laminate portion in the optical device. In this case, if, for example, the laminate body is a light emitting device, a light emitting diode, or an organic light emitting device, the body may have a layer containing at least one fluorescent filler (hereinafter also referred to as a "phosphor layer") between the light source and the solid silicone material of the present invention. When the solid silicone material according to the present invention is used as a light diffusing material for diffusing light incident on a light receiving sensor, in particular as a light diffusion coating layer, or light diffusion film or sheet, spherical fused silica particles and/or spherical fused alumina particles are in particular preferably used as component B.

[Laminate Body Formed of a Film or Sheet Coating Layer of the Solid Silicone Material of the Present Invention on a Peelable Base Material]

A peelable base material generally includes a base material and a peelable layer formed thereon, and a film-like or sheet-like material is formed on the peelable layer generally by a coating method so as to enable simple peeling of the film or sheet material from the base material.

First, a laminate body in which a film-like or sheet-like material of a solid silicone material including a cured product obtained from a curable composition of the present invention is arranged on a peelable layer will be described. Film or sheet-like materials including the solid silicone material of the present invention, and laminate bodies containing the same, may be required to be handled in a stand-alone form, separated from the base material, if desired. When a solid layer including the solid silicone material of the present invention is arranged on a peelable layer, the film or sheet-like material containing the solid silicone material of the present invention or the laminate body containing the same can be easily separated and handled from the release layer including the peelable substrate together with the base material. This manner of peelable base material can have a peelable layer opposite a solid layer, such as a film-like layer including the solid silicone material of the present invention, and optionally may also have other peelable layers. The following are examples of a configuration of a laminate body including a solid layer containing a peelable base material and a solid silicone material of the present invention. Note that in the following examples, "/" means that the respective layers face one another in the lamination direction of the laminate (typically the thickness direction orthogonal to the substrate). In addition, the substrate and the release layer may be an integral unit or the same layer (a substrate provided with material or physical irregularities so as to be releasable).

Example 1: base material, peelable layer, solid layer including a solid silicone material, other arbitrary layer (can be one or more layers)

Example 2: base material, peelable layer, solid layer including a solid silicone material, other arbitrary layer (can be one or more layers), peelable layer, base material Here, “other arbitrary layer” refers to a layer that may be used as desired but can be left out. Other optional layers include, but are not limited to, for example, a pressure-sensitive adhesive layer.

In particular, when the laminate body has a configuration in which a film-like or sheet-like material including the solid silicone material of the present invention is sandwiched between two peelable layers, as in Example 2 above, the material with a solid layer including the solid silicone material of the present invention can be transported (including export to a foreign country) while protected by the base material. At a desired time and place, the peelable base material with the peelable layer can be separated from both sides of the laminated body, and the film-like or sheet-like material including the solid silicone material of the present invention, or only the laminated material including this can be arranged or laminated in a desired structure, for example a light emitting device light source, or the light incident surface of a light receiving sensor or the like. This is particularly useful when the laminated material in the portion excluding the peelable base material is a laminated sheet or the like having a solid layer and a phosphor layer including the solid silicone material of the present invention, since the handling workability thereof can be improved.

The type of the aforementioned base material is not particularly limited, and examples include paperboard, cardboard paper, clay-coated papers, and polyolefin laminate papers, particularly including polyethylene laminate papers, synthetic resin films and sheets, natural fiber woven materials, synthetic fiber woven materials, artificial leather woven materials, and metal foils. In particular, for the base material, synthetic resin films and sheets are preferable, with examples of synthetic resins including: polyimides, polyethylenes, polypropylenes, polystyrenes, polyvinyl chlorides, polyvinylidene chlorides, polycarbonates, polyethylene terephthalates, cyclopolyolefins, and nylons. The substrate is preferably a film-like or a sheet-like substrate. The thickness of the base material is not particularly limited, and a desired thickness can be used according to the application. Note that, the base material itself described above may be a material that functions as a peelable layer, and/or may have a structure provided with peelability by forming physically fine irregularities on the surface of the base material.

The peelable layer may also be referred to as a peelable liner, peel layer, or peelable coating layer, and is suitably a peelable layer having a peelable coating capability such as a silicone peeling agent, fluorine peeling agent, alkyd peeling agent, or fluorosilicone peeling agent. Alternatively, the surface of the base material may be physically formed with fine irregularities or the base material may be formed from a material that is difficult to adhere to the solid silicone material of the present invention. In these cases, an additional peelable layer made of a material different from the base material may be formed on the base material, but not having a further peelable layer is feasible, in which case the peelable layer is the portion of the surface of the base material that exhibits peelability.

The solid layer including the solid silicone material of the present invention can be formed by forming a film on the peelable layer of the peelable base material described above using the same method as described in <Method for Forming a Film, Sheet, or Thin Film of a Curable Organopolysiloxane Composition> above. In particular, according to the method described above, a liquid in which the curable organopolysiloxane composition of the present invention is uniformly dispersed in an organic solvent such as i-propyl alcohol or methyl isobutyl ketone is coated on the peelable layer of the film-like base material or the sheet-like base material, and then the organic solvent is removed by drying or other means and the curable composition is cured, thereby forming a solid layer including a film-like or sheet-like solid silicone material on the peelable layer of the base material. The film thickness of the solid silicone material in film or sheet form can be suitable for the intended application, but when used as a light diffusing material, the film thickness is generally preferably in the range of 10 to 500 μm as described above. When the composition of the present invention is used as an encapsulant for a light emitting diode or an organic light emitting device, the thickness should be in the range of 10 to 500 μm.

The solid layer containing the solid silicone material of the present invention may be used alone, but is more preferably a laminate member in which the same or different layers are laminated on the solid layer. In particular, the other layers of the laminate member are preferably cured layers or solid organopolysiloxane layers (silicone layer) containing a cured organopolysiloxane having a curing reactive functional group, and are preferably silicone cured layers containing an organopolysiloxane having a hydrosilylation reactive group and/or a radical reactive group, a condensation or a de-alcohol reactive group, which are cured and reacted in the presence of a catalyst. Herein, the organopolysiloxane having a curing reactive group may be straight chain, branched chain, cyclic, or resinous, and a combination of two or more types of curing reactions may be utilized.

Particularly suitably, the other silicone layers arranged on the solid layer containing the solid silicone material obtained from the curable composition of the present invention is a polymeric solid organopolysiloxane. The silicone layer is preferably a silicone layer in which the phosphor described below is dispersed in the solid organopolysiloxane.

The layers other than the layer containing the solid silicone material formed from the curable organopolysiloxane composition of the present invention in the laminate member described above is preferably one or more layers, or multiple layers with two or more different functions. Furthermore, the thickness of the entire laminate member laminated on the solid layer containing the solid silicone material of the present invention is not particularly limited, but is preferably 5 μm or more, and from the viewpoint of handling workability, the thickness may be 50 to 10,000 μm, particularly preferably a range of 100 to 1,000 μm.

One or more layers laminated on the solid layer containing the solid silicone material of the present invention, in particular a silicone layer different from the solid layer, is preferably a phosphor layer containing at least one or more phosphors. Such a phosphor layer, in particular, functions as a wavelength converting material, and when placed on a light source, the emission wavelength can be converted. There is no particular limitations to this phosphor, with examples thereof including yellow, red, green, and blue light emitting phosphor, included in oxide phosphors, oxynitride phosphors, nitride phosphors, sulfide phosphors, oxysulfide phosphors, and the like, that are widely used in light emitting diodes (LED) and organic light emitting devices (OLED). Examples of the oxide phosphors include: yttrium, aluminum, and garnet-type YAG green to yellow light phosphors containing cerium ions; terbium, aluminum, and garnet-type TAG yellow light phosphors containing cerium ions; and silicate green to yellow light phosphors containing cerium or europium ions. In addition, exemplary oxynitride phosphors include silicon, aluminum, oxygen, and nitrogen type SiAlON red to green light phosphors containing europium ions. Exemplary nitride phosphors include calcium, strontium, aluminum, silicon, and nitrogen type CASN red light phosphors containing europium ions. Exemplary sulfide phosphors include ZnS green light phosphors containing copper ions or aluminum ions. Exemplary oxysulfide phosphors include $Y_2O_2S$ red light phosphors containing europium ions. The laminate body of the present invention may contain two or more phosphors in combination.

The silicone layer other than the solid silicone material layer formed from the cured product of the curable composition of the present invention may be a silicone layer containing reinforcing fillers, since these layers increase the mechanical strength of the silicone layer and improve the protection and adhesion to the adjacent layers in the above laminate body. Furthermore, the silicone layer may also be a silicone layer containing a thermally conductive filler or an electrically conductive filler, in order to impart thermal or electrical conductivity to the cured product. Note that the above phosphors and fillers may be used in combination, and in order to improve the dispersibility in the silicone layer, the surface of the particulate component of these phosphors may be surface treated with a compound selected from alkoxysilane, organohalosilane, organosilazane, and siloxane oligomer, or the like.

The laminate body described above has a structure in which a solid layer containing a solid silicone material formed from the curable composition of the present invention is arranged on a release layer, and particularly suitably, also has a phosphor layer which is a different silicone layer from the solid layer and contains a phosphor or the like. If the solid layer containing the solid silicone material of the present invention is arranged on the release layer, the solid layer containing the solid silicone material of the present invention or the laminated member including the solid layer can be easily separated from the release layer included in the laminated member, and the separated laminated member can be used as is for manufacturing other structures such as optical members or the like.

<Laminate Body with Light Source and Phosphors, Light Emitting Devices>

The solid layer containing the solid silicone material obtained from the curable composition of the present invention can be arranged at the interface with air, and when arranged on a light source of a light emitting diode (LED) or organic light emitting device (OLED), the solid layer containing the solid silicone material of the present invention can be arranged at the interface with air, and can improve the light extraction efficiency of the entire laminate body including the light source. The laminate body preferably has a phosphor layer containing the same phosphor as described above as a wavelength converting material for the light source, and in particular, has a silicone layer containing the phosphor. Herein, the light emitted from the light source is preferably wavelength-converted by the phosphor layer and provided so as to reach the solid layer containing the solid silicone material of the present invention arranged at the interface with air, and the solid layer containing the solid silicone material of the present invention may be formed so as to partially or entirely cover the phosphor layer, or may be arranged outside the phosphor layer through a functional layer of another laminate body. Although the thickness of the laminate body as a whole is not particularly limited, the thickness is preferably 1 μm or more, and in the case of a light emitting device or the like, the thickness may be 50 to 10,000 μm, excluding the thickness of the light source portion, with a range of 100 to 1,000 μm being particularly preferable.

<Improvement of Light Extraction Efficiency and Heat Resistance>

The laminate body with a light source and a phosphor layer is a light emitting device such as a light emitting diode (LED) or an organic light emitting device (OLED), and with the aforementioned arrangement of the light source, the phosphor layer, and the solid layer containing the solid silicone material of the present invention, the light extraction efficiency of the light emitting device can be improved. Furthermore, the use of a solid layer containing a solid silicone material according to the present invention may prevent discoloration or the like due to heat generation of the light emitting device, and in particular, may improve the heat resistance of the light emitting device, compared with the use of a different material.

[Manufacturing Method of Laminate Body]

Although there is no particular restriction on the method for producing the laminate body containing the cured product obtained from the curable organopolysiloxane composition of the present invention, the method preferably has any of the following processes (i) to (iii). Note that the coating method or the like of the process is not particularly limited, but the method described in the method for producing a film or sheet-like material formed from a cured product obtained from the curable composition of the present invention described above can be suggested.

(i) A process of forming the solid silicone material into a film or sheet or thin film on another structure if the solid silicone material obtained by curing the curable organopolysiloxane composition of the present invention has hot melt properties;

(ii) A process of dispersing the curable organopolysiloxane composition of the present invention in an organic solvent, coating the dispersion on another structure in the form of a film or thin film, then removing the organic solvent, and curing the film;

(iii) a process of laminating another structure onto a film or sheet-like material containing the solid silicone material obtained by curing the curable organopolysiloxane composition of the present invention.

Herein, a thin film-like material refers to a film-like material that is thin.

In particular, the solid silicone material obtained by curing the curable composition of the present invention can be handled in the form of a laminate body that can be peeled from a base material, and a solid layer containing the solid silicone material of the present invention, or a laminate member containing the solid silicone material, can be easily separated from the peeling layer of the base material and used. The solid layer containing the solid silicone material of the present invention which has been peeled off from the release layer, or the laminated member including the solid silicone material, is suitable as is for use as an optical member or the like, or for use in the manufacture of other structures, such as optical devices or members. Accordingly, as a manufacturing method for a laminate body containing the solid silicone material of the present invention, a manufacturing method containing all of the following processes is particularly preferable. In particular, the other structure is preferably a precursor of a light emitting device with a light receiving sensor or a light source or the like, and that the manufacturing method is a manufacturing method for a light emitting device or a light receiving sensor with a solid layer containing the solid silicone material of the invention provided at the interface with air.

(a): A process in which a liquid containing the curable organopolysiloxane composition of the present invention dispersed in an organic solvent is coated onto the release layer of the release substrate in the form of a film or thin film, and then the organic solvent is removed and the composition is cured to form a solid silicone material;

(b): a process of laminating the same or different silicone layers onto the film-like or thin-film-like solid silicone material obtained in process (a);

(c): a process of obtaining a laminate by peeling off the film-like or thin-film-like solid silicone material obtained in process (b) and the silicone layer laminated thereon as a single layer from the release layer; and (d): a process of laminating the laminate body obtained in process (c) onto another structure.

<Properties and Preferred Uses of the Solid Silicone Material Obtained by Curing the Curable Organopolysiloxane Composition of the Present Invention>

The curable composition of the present invention includes components A, B, and C. By setting the ratio of aryl groups to the groups bonded to the silicon atom of component A to be less than 0 to 10 mol %, preferably 0 to 5 mol %, the solid silicone material obtained by curing the curable composition will have high flexibility and high breaking elongation. The curable organopolysiloxane composition of the present invention is suitable for use as a coating agent in which the curable organopolysiloxane composition of the present invention is dissolved and dispersed in a solvent if desired. Further, by combining component B with components A and C, the curable composition of the present invention can produce a highly flexible solid silicone material, the adhesiveness between the inorganic filler of component B and the matrix material containing components A and C can be improved in the resulting solid silicone material, and the breaking elongation of the solid silicone material is significantly improved, as compared with the case where component C is not used. In addition, the solid silicone material obtained from the curable composition of the present invention has high flexibility and improved elongation at break, which increases the trackability of the material to thermal deformation, and improves heat resistance.

The curable composition of the present invention is a liquid obtained by dissolving at least a portion of the components in the solvent and dispersing the inorganic filler, either as is, or by diluting in a solvent, and then coating on a base material, removing the solvent if a solvent is used, and curing the coated curable composition, and therefore is suitable for use as a coating agent for forming a coating layer on a base material. When the cured product obtained from the curable composition of the present invention is used as a coating material, the thickness of the coating layer containing the solid silicone material after curing should be 10 to 500 μm, but is not limited to this thickness.

The curable composition of the present invention is suitable as a material for use as an optical member for an optical device. Applications for which the curable composition of the invention is particularly suitable include light diffusing materials for light receiving sensors, and in particular, materials for light diffusing films or light diffusing layers provided in front of the light receiving part of the sensor. In this case, component B is preferably spherical fused silica particles, spherical fused alumina particles, or a combination thereof. The curable composition of the present invention is preferable as a material for use as an optical member of a light emitting diode (LED) or an organic light emitting device (OLED), for example, as an encapsulant. For this use, the aforementioned spherical fused silica particles, spherical fused alumina particles, or a combination thereof may be used as component B. Furthermore, a fluorescent filler is preferably used to provide a wavelength converting function.

However, the curable composition of the present invention is not limited to the aforementioned use, and can be used for any application.

Furthermore, the solid silicone material obtained by curing the curable organopolysiloxane composition of the present invention has high durability during a reflow soldering process, and low discoloration of the solid silicone material during the same process.

EXAMPLES

Hereinafter, the present invention will be described with reference to examples, but the present invention is not limited to these examples. In the compositional or structural formulae shown in the descriptions and tables of the following examples, Me represents a methyl group, Ph represents a phenyl group, and Vi represents a vinyl group.

In this specification, the ratio (mole %) of aryl groups to organic groups bonded to the silicon atom of the organopolysiloxane is a value determined by $^{13}C$-, $^{29}Si$-NMR. However, if a compound having an aryl group is not used as the raw material for the production of the organopolysiloxane, the ratio of aryl groups to organic group will naturally be 0 mol %, so there is no need for measurement.

<Solution A Preparation>

A divinyl disiloxane complex of platinum was added in an amount to achieve a platinum content of 2.5 ppm was added to the mixture of organopolysiloxane containing a vinyl group expressed by composition formula $(Me_3SiO_{1/2})_{0.415}(Me_2ViSiO_{1/2})_{0.085}(SiO_2)_{0.50}$ (41.7 g), organopolysiloxane containing a vinyl group expressed by the average structural formula $(Me_2ViSiO_{1/2})_2(Me_2SiO)_{770}$ (49.4 g), and SiH terminated organohydrogen polysiloxane expressed by composition formula $(Me_2HSiO_{1/2})_{0.645}(SiO_2)_{0.355}$ (8.8 g). Mixing to achieve uniformity was performed using mechanical force to obtain Liquid A. The amount of aryl groups in the groups bonded to the silicon atoms of the organopolysiloxane contained in Liquid A is 0 mol %.

<Solution B Preparation>

Platinum divinyldisiloxane complex was added in an amount to achieve a platinum content of 2.5 ppm to a mixture of a vinyl group-containing organopolysiloxane (30 g) expressed by composition formula: $(Me_3SiO_{1/2})_{0.34}(Me_2ViSiO_{1/2})_{0.11}(SiO_2)_{0.55}$, a vinyl group-containing organopolysiloxane (45 g) expressed by average structural formula: $(Me_2ViSiO_{1/2})_2(Me_2SiO)_{530}$, a vinyl group-containing organopolysiloxane (20 g), expressed by average structural formula: $(Me_2ViSiO_{1/2})_2(Me_2SiO)_{150}$, an organohydrogenpolysiloxane (4 g) containing a terminal SiH expressed by average structural formula: $(Me_3iSiO_{1/2})_2(MeHSiO)_{50}$, and an organopolysiloxane (0.5 g) expressed by composition formula $(MeViSiO)_{22.5}(EpSiO_{3/2})_{31.1}(Me_2SiO)_{46.4}(OR)_n$ (In the formula, Ep represents a gamma glycidoxypropyl group and R represents Me or H). Furthermore, the following additive 1, a compound expressed by structural formula $(Me_2ViSiO_{1/2})(Me_2SiO)_3((MeO)_3SiO_{1/2})$ (0.5 g) was added, and the mixture was uniformly stirred using mechanical force to obtain liquid B. The number of aryl groups in the groups bonded to the silicon atoms of the organopolysiloxane contained in liquid B is 0 mol %.

Hereinafter, the average thicknesses of the sheet-like composition in the examples and the like were measured using a film thickness meter (DIGIMICRO MFC-101A, manufactured by Nikon).

The additives used in the following reference examples, examples, and comparative examples are as follows Additive 1: Compound expressed by structural formula $(Me_2ViSiO_{1/2})(Me_2SiO)_3((MeO)_3SiO_{1/2})$ Additive 2: Compounds expressed by the average structural formula $(Me_2ViSiO_{1/2})(Me_2SiO)_{25}((MeO)_3SiO_{1/2})$ Additive 3: Aryltrimethoxysilane Additive 4: Organopolysiloxane expressed by the composition formula $(MeViSiO)_{22.5}(EpSiO_{3/2})_{31.1}(Me_2SiO)_{46.4}(OR)_n$ (Ep represents a gamma-glycidoxypropyl group and R represents Me or H)

Additive 5: Dodecyltrimethoxysilane

Additive 6: Double-ended vinyl polysiloxane expressed by the average structural formula $(Me_2ViSiO_{1/2})_2(Me_2SiO)_{290}$ Additive 7: Compounds expressed by the average structural formula $(Me_3SiO_{1/2})(Me_2SiO)_{30}((MeO)_3SiO_{1/2})$ Additive 8: Vinyltrimethoxysilane The fillers used in the following reference examples, examples and comparative examples are as follows. The average particle diameter ($d_{50}$) below is the value measured by the Coulter method or laser diffraction scattering method.

Filler I: Alumina beads with an average particle size of 5 μm manufactured by Showa Denko K.K. Spherical alumina particles CB-P05

Filler II: Spherical fused silica particles with an average particle diameter of 3 μm manufactured by DENKA Corporation FB-3SDC Filler III YAG-type yellow phosphor NYAG4454-S produced by Intematix with an average particle diameter of 8 μm

[Method to Manufacture the Cured Product]

Additives and fillers in the amounts shown in the table below were added to the liquid A, and the mixture was uniformly stirred using mechanical force while degassing under reduced pressure.

The resulting prepared solution was pressed at 125° C. for 15 minutes using a 1 mm thick mold, and then heated in an oven at 150° C. for 1 hour to produce a 1 mm sheet containing the cured product.

The tensile strength and elongation properties of the prepared sheets of cured product were measured by cutting out 1 mm thick samples from the above sheets of cured product using a Super Dumbbell Cutter SDK-300-D manufactured by Dumbbell in accordance with JIS K-6251-3 and using as measurement samples. This measurement sample was used to measure the fracture strength and elongation at break at a tensile speed of 15 mm/min using a Shimadzu Autograph AGS-X with a 1 kN load cell attached.

Furthermore, the fractured surface of the samples after measuring the fracture strength was observed by SEM. Fracture surfaces were observed by SEM using a Hitachi SEM TM4000PLUS Microscope at a magnification of 8000×. Interface exfoliation was defined as the material exfoliating and breaking from the surface of the filler particles and/or near the surface of the filler particles, and cohesive failure was defined as the cured organopolysiloxane polymer matrix breaking away from the surface or near the surface of the filler particles.

The results obtained are shown in Table 1 and Table 2 below.

TABLE 1-1

| | Reference Example 1 | Example 1 | Example 2 | Example 3 | Example 4 | Example 5 | Example 6 |
|---|---|---|---|---|---|---|---|
| A liquid | 30 | 29.97 | 29.94 | 29.91 | 29.88 | 29.85 | 29.85 |
| Additive 1 | | 0.1 | 0.2 | 0.3 | 0.4 | 0.5 | |
| Additive 2 | | | | | | | 0.5 |
| Additive 3 | | | | | | | |
| Additive 4 | | | | | | | |
| Additive 5 | | | | | | | |
| Additive 6 | | | | | | | |
| Additive 7 | | | | | | | |
| Additive 8 | | | | | | | |
| Filler I | 70 | 69.93 | 69.86 | 69.79 | 69.72 | 69.65 | 69.65 |
| Total | 100 | 100 | 100 | 100 | 100 | 100 | 100 |
| Fracture strength (MPa) | 8.4 | 8.9 | 8.7 | 9.1 | 8.2 | 8.1 | 8.9 |
| Elongation % at break | 43.7 | 51.1 | 50.0 | 50.4 | 55.7 | 61.9 | 54.1 |
| Main failure mode | Interfacial peeling | Cohesive failure | Cohesive failure | Cohesive failure | Cohesive failure | Cohesive failure | Cohesive failure |

TABLE 1-2

| | Example 7 | Comparative Example 1 | Comparative Example 2 | Comparative Example 3 | Comparative Example 4 |
|---|---|---|---|---|---|
| A liquid | 29.85 | 29.85 | 29.85 | 29.85 | 29.85 |
| Additive 1 | | | | | |
| Additive 2 | | | | | |

TABLE 1-2-continued

| | Example 7 | Comparative Example 1 | Comparative Example 2 | Comparative Example 3 | Comparative Example 4 |
|---|---|---|---|---|---|
| Additive 3 | 0.5 | | | | |
| Additive 4 | | | | | |
| Additive 5 | | 0.5 | | | |
| Additive 6 | | | 0.5 | | |
| Additive 7 | | | | 0.5 | |
| Additive 8 | | | | | 0.5 |
| Filler I | 69.65 | 69.65 | 69.65 | 69.65 | 69.65 |
| Total | 100 | 100 | 100 | 100 | 100 |
| Fracture strength (MPa) | 8.5 | 4.9 | 8.5 | 4.4 | 7.5 |
| Elongation % at break | 57.1 | 24.9 | 42.3 | 28.0 | 75.1 |
| Main failure mode | Cohesive failure | Interfacial peeling | Interfacial peeling | Interfacial peeling | Interfacial peeling |

TABLE 2

| | Example 8 | Example 9 | Reference Example 2 | Reference Example 3 |
|---|---|---|---|---|
| A liquid | 39.8 | 39.8 | 40 | 40 |
| Additive 1 | 0.5 | 0.5 | | |
| Filler II | 59.7 | | 60 | |
| Filler III | | 59.7 | | 60 |
| Total | 100 | 100 | 100 | 100 |
| Fracture strength (MPa) | 8.1 | 7.9 | 8.5 | 6.1 |
| Elongation % at break | 37.4 | 73.6 | 32.4 | 55.7 |
| Main failure mode | Cohesive failure | Cohesive failure | Interfacial peeling | Interfacial peeling |

Furthermore, SEM photographs of the fracture surfaces of the test samples of Example 5 and Comparative Example 3 after measuring the fracture strength are shown in FIGS. 1 and 2.

FIG. 1: SEM photograph of the fractured surface of the sample of Example 5

FIG. 2: SEM photograph of the fractured surface of the sample of Comparative Example 3

In the test sample of Example 5 shown in FIG. 1, the surface of the filler particles seen on the fracture surface was irregularly shaped and not smooth, and it was observed that the surface of the filler particles was covered with cured organopolysiloxane polymer. On the other hand, in the test sample of Comparative Example 3 shown in FIG. 2, the surface of the filler particles seen on the fracture surface is smooth and not covered by the cured organopolysiloxane polymer, indicating that delamination occurred at the interface between the filler particles and the organopolysiloxane polymer.

Summary of Reference Example 1, Examples 1 to 7, and Comparative Examples 1 to 4

In contrast to the compositions containing a filler without an additive in Reference Example 1, the curable compositions of Examples 1 to 7 contained additives 1 to 3 corresponding to component (C) of the present invention, and therefore the filler and the cured organopolysiloxane matrix are integrated, and separating of the matrix polymer from the filler interface and breaking of the material can be suppressed. The elongation at break of the material was improved from between 43.7% and 50.0% to 61.9%, without significant change in the fracture strength (approximately 8 to 9 MPa). When a compound having a chemical structure different from that of component (C) of the present invention is used as an additive, the fracture strength and elongation at break are reduced and the toughness is inferior to that of the cured product of the present invention, presumably because a sufficiently strong bond cannot be created between the filler surface and the organopolysiloxane matrix. In addition, Comparative Example 4 used vinyl trimethoxysilane, which has a different structure from component (C) of the additive, but the carbon chain of the reactive group bonded to the silicon atom is short in the vinyl group, which is the reactive group of vinyl trimethoxysilane, and therefore the bond between the filler surface and the organopolysiloxane matrix is not sufficiently formed. As a result, the cross-linking between the polymers and the bonding between the filler and the matrix is insufficient because the vinyltrimethoxysilane blocks the terminal functional group of the organopolysiloxane matrix, and thus the fracture strength of the cured product decreases and the elongation at break increases due to the softening of the material itself and the hardness of the material is not maintained as originally intended.

Summary of Reference Examples 2 and 3 and Examples 8 and 9

In contrast to the compositions without the additive in Reference Examples 2 and 3, the inclusion of additive 1 of component (C) of the present invention in Examples 8 and 9 which contain the additive results in the formation of a bond between the filler and the organopolysiloxane matrix via the additive, integrating the filler and the matrix, thus preventing the organopolysiloxane from peeling from the filler interface, and the breaking of the material is suppressed. As a result, the cured products of Examples 8 and 9 were able to improve the elongation at break of the material from 32.4% to 37.4% and from 55.7% to 73.6%, respectively, while maintaining almost the same fracture strength (approximately 6 to 8 MPa) compared to the case without Additive 1.

Examples 10 to 14

<Preparation of Film Samples with a Thickness of Less than 100 μm>

Filler I at the amounts shown below in Table 3 were added to Liquid A or Liquid B (Liquid B contains Additive 1), and an appropriate amount of propyl propionate solvent was added to appropriately adjust the viscosity of the composition, and then the mixture was uniformly stirred using mechanical force while degassing under reduced pressure to obtain each prepared liquid.

The prepared solution was applied using a spin coater to a cover glass 24×60×0.13-0.17 mm made by Matsunami Glass, and then heated in an oven at 150° C. for 1 hour to create a cured product.

<Preparation of Film Samples with a Thickness of 100 μm or More>

Additive 1 and Filler I were added in the amounts shown below in Table 3 to the Liquid A, and the mixture was uniformly stirred using mechanical force while degassing under reduced pressure to obtain each prepared liquid.

The prepared solution was pressed at 125° C. for 15 minutes using a mold having the thickness shown in Table 3, and then heated in an oven at 150° C. for 1 hour to create a cured product.

<Measurement of Light Diffusion Characteristics and Transmittance of Film Samples>

The light transmission and scattering measurement of the film sample prepared by the method described above was performed using a Genesia Gonio/Far Filed Profiler manufactured by Genesia, using a 45 degree bi-directional transmittance distribution function. The sample was determined to be a good light diffusing material if the light intensity at the position where the light receiving unit was inclined at 45 degrees with respect to the incident light axis with the measurement sample at the center was 0.65 or higher taking direct transmitted light intensity as 1 (the results are shown by 0 in Table 3).

The visible-ultraviolet spectral properties of the film samples, for example, light transmittance, were measured using a Japan Spectroscopic V770 UV-Vis-NIR spectrophotometer fitted with a 150 mmφ integrating sphere unit.

The heat resistance of the aforementioned film samples was measured using a Malcolm RDT-250C reflow device, where the samples were heated between 160 and 200° C. for 3 minutes, then rapidly heated and held above 260° C. for 10 seconds, and then air-cooled to 150° C. After repeating this operation three times, film samples with less than a 2% decrease in transmittance in the range of visible light (380-740 nm) were considered to have favorable heat resistance (these results are shown with O in Table 3).

TABLE 3

| | Example 10 | Example 11 | Example 12 | Example 13 | Example 14 |
|---|---|---|---|---|---|
| Liquid A | | | 39.6 | 29.7 | 29.5 |
| B Liquid (with 1 additive) | 10 | 30 | | | |
| Additive 1 | | | 0.4 | 0.3 | 0.5 |
| Filler I | 90 | 70 | 60 | 70 | 70 |
| Thickness | 23 μm | 40 μm | 40 μm | 40 μm | 500 μm |
| Diffusion performance based on 45-degree bi-directional transmittance distribution intensity ratio | ○ | ○ | ○ | ○ | ○ |
| Transparency | ○ | ○ | ○ | ○ | ○ |
| Heat resistance | ○ | ○ | ○ | ○ | ○ |

Summary of Examples 10 to 14

The results of Examples 10 to 14 show that the curable organopolysiloxane composition of the present invention exhibits good light diffusivity and transmittance even in a film having a thickness of less than 100 μm as well as in a film having a thickness of 500 μm, and furthermore, the heat resistance is also favorable.

The invention claimed is:

1. A curable organopolysiloxane composition, comprising:

A) an organopolysiloxane component having at least two radical reactive groups and/or reactive groups that can be cross-linked by a hydrosilylation reaction within the molecule, where less than 10 to 0 mol % of total organic groups bonded to silicon atoms within the molecule are aryl groups B) one or more inorganic fillers; and C) an organosilicon compound that differs from component A);

wherein component A) comprises A1) and A2) as follows:

A1) a straight chain or branched chain organopolysiloxane different from component A2);

A2) an organopolysiloxane comprising i) and ii) as follows:

i) a resin structural block having $R^1SiO_{3/2}$ units and optionally $SiO_{4/2}$ units, where $R^1$ represents a group selected from the group consisting of a monovalent organic group, a hydroxyl group, and an alkoxy group having 1 to 6 carbon atoms, and ii) a straight chain diorganopolysiloxane structural block represented by $(R^2_2SiO_{2/2})_n$ where each $R^2$ independently represents an alkyl group having 1 to 20 carbons or a substituted or unsubstituted aryl group having 6 to 14 carbons, optionally substituted with a halogen atom, and n represents a number within a range of 3 to 1000, wherein at least a portion of $R^1$ and $R^2$ are reactive groups that can be cross-linked by a radical reaction and/or a hydrosilylation reaction, and the ratio of aryl groups with 6 to 14 carbon atoms included in the total number of moles of the $R^1$ and $R^2$ groups, but excluding hydroxyl groups, is less than 10 to 0 mols;

wherein the mass of the component B) is 30 to 95% relative to the mass of the overall composition; and wherein component C) is a straight chain or branched organosilicon compound expressed by the following general formula:

$$(R^aR^b_2SiO)_p—K—(SiR^b_2—Y—Si(R^b)_q(OR^c)_{3-q})_r$$

where each $R^a$ independently represents an alkenyl group; each $R^b$ independently represents a group selected from the group consisting of monovalent hydrocarbon groups, halogenated hydrocarbon groups, and cyanoalkyl groups; each $R^C$ independently represents a group selected from the group consisting of a hydrogen atom, an alkyl group having 1 to 10 carbons, and an alkoxyalkyl group having a total of 2 to 10 carbon atoms; and K represents a silicone resin structural block or a group selected from the group consisting of the average composition formula:

$$(R^b{}_3SiO_{1/2})_s(R^b{}_2SiO_{2/2})_t(R^bSiO_{3/2})_u(SiO_{4/2})_v(OR^C)_w$$

where each of $R^b$ and $R^c$ are as defined above, s, t, u, v and w each represent the number of each unit, and each independently represents a number from 0 to 500, provided that all of t, u, and v are not 0, and the value of (s+w) is less than (u+2v); and Y represents an oxygen atom, a divalent hydrocarbon group, or a group expressed by the general formula:

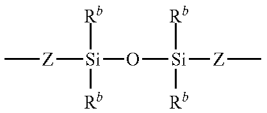

where $R^b$ is as defined above, and each Z is a divalent hydrocarbon group; and p represents a number from 1 to 10, r represents a number from 1 to 10, and q represents a number from 0 to 2; and wherein the resin structural block i) of component A2) has both R SiQ3/2 units and SiO4/2 units.

2. The curable organopolysiloxane composition according to claim 1, wherein component B) is selected from the group consisting of spherical silica particles, spherical alumina particles, and fluorescent fillers.

3. The curable organopolysiloxane composition according to claim 2, wherein the spherical silica particles are spherical fused silica particles and the spherical alumina particles are spherical fused alumina particles.

4. The curable organopolysiloxane composition according to claim 1, wherein component C) is an organosilicon compound expressed by the following structural formula:

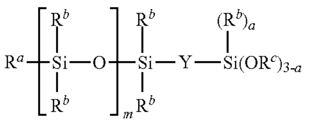

where $R^a$ represents an alkenyl group; each $R^b$ independently represents a group selected from the group consisting of monovalent hydrocarbon groups, halogenated hydrocarbon groups, and cyanoalkyl groups; each $R^c$ independently represents a group selected from the group consisting of a hydrogen atom, alkyl groups having 1 to 10 carbons, and alkoxyalkyl groups having 2 to 10 carbons in total; m is a number within a range of 0 to 500, a is 0, 1, or 2, and Y is an oxygen atom, a divalent hydrocarbon group, or a group as expressed by general formula:

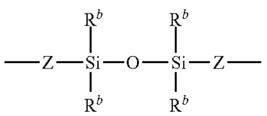

where $R^b$ is as defined above, and each Z is a divalent hydrocarbon group.

5. A cured product, obtained from the curable organopolysiloxane composition according to claim 1.

6. The cured product according to claim 5, wherein the optical transmittance is 40% or more.

7. The cured product according to claim 5, wherein in a bidirectional transmittance distribution function using a white light source, the transmitted light intensity at a light receiving position inclined at 45 degrees to the direct transmitted light with the measurement sample at the center is 0.65 or higher, based on the direct transmitted light intensity being 1.

8. The cured product according to claim 5, wherein the breaking elongation is at least 30%.

9. An optical member, comprising the cured product according to claim 4.

10. The optical member according to claim 9, wherein the optical member is a light diffusion coating film material for a light receiving sensor having a thickness of 500 μm or less.

11. The optical member according to claim 9, wherein the optical member is an encapsulant for a light emitting diode or an organic light emitting device.

12. An optical device, comprising the optical member according to claim 9.

13. A coating agent comprising the curable organopolysiloxane composition according to claim 1 and an organic solvent.

14. The curable organopolysiloxane composition according to claim 1, wherein component C) comprises a compound represented by the general formula:

$$Vi(CH_3)_2Si—(OSi(CH_3)_2)_n—OSi(OCH_3)_3$$

wherein Vi represents a vinyl group, and n represents 1 to 50.

15. The curable organopolysiloxane composition according to claim 1, wherein component C) comprises:

a compound conforming to the average structural formula $(Me_2ViSiO_{1/2})(Me_2SiO)_3((MeO)_3SiO_{1/2})$;

a compound conforming to the average structural formula $(Me_2ViSiO_{1/2})(Me_2SiO)_{25}((MeO)_3SiO_{1/2})$;

allyl trimethoxysilane; or combinations thereof.

16. A curable organopolysiloxane composition, comprising:

A) an organopolysiloxane component having at least two radical reactive groups and/or reactive groups that can be cross-linked by a hydrosilylation reaction within the molecule, where less than 10 to 0 mol % of total organic groups bonded to silicon atoms within the molecule are aryl groups;

B) one or more inorganic fillers; and

C) an organosilicon compound that differs from component A);

wherein component A) comprises A1) and A2) as follows:

A1) a straight chain or branched chain organopolysiloxane different from component A2);

A2) an organopolysiloxane comprising i) and ii) as follows:

i) a resin structural block having $R^1SiO_{3/2}$ units and optionally $SiO_{4/2}$ units, where $R^1$ represents a group selected from the group consisting of a monovalent organic group, a hydroxyl group, and an alkoxy group having 1 to 6 carbon atoms, and ii) a straight chain diorganopolysiloxane structural block represented by $(R^2{}_2SiO_{2/2})_n$ where each $R^2$ independently represents an alkyl group having 1 to 20 carbons or a substituted or unsubstituted aryl group having 6 to 14 carbons, optionally substituted with a halogen atom, and n represents a number within a range of 3 to 1000, wherein at least a portion of $R^1$ and $R^2$ are reactive groups that can be cross-linked by a radical reaction and/or a hydrosilylation reaction, and the ratio of aryl groups with 6 to 14 carbon atoms included in the total number of moles of the $R^1$ and $R^2$ groups, but excluding hydroxyl groups, is less than 10 to 0 mols;

wherein the mass of the component B) is 30 to 95% relative to the mass of the overall composition; and wherein component C) is a straight chain or branched organosilicon compound expressed by the following general formula:

$$R^aR^b_2SiO)_p\text{—}K\text{—}(Si(R^b)_q(OR^c)_{3-q})_r$$

where each $R^a$ independently represents an alkenyl group; each $R^b$ independently represents a group selected from the group consisting of monovalent hydrocarbon groups, halogenated hydrocarbon groups, and cyanoalkyl groups; each $R^c$ independently represents a group selected from the group consisting of a hydrogen atom, an alkyl group having 1 to 10 carbons, and an alkoxyalkyl group having a total of 2 to 10 carbon atoms; and K represents a silicone resin structural block or a group selected from the group consisting of the average composition formula:

$$R^b_3SiO_{1/2})_s(R^b_2SiO_{2/2})_t(R^bSiO_{3/2})_u(SiO_{4/2})_v(OR^c)_w$$

where each of $R^b$ and $R^c$ are as defined above, s, t, u, v and w each represent the number of each unit, and each independently represents a number from 0 to 500, provided that all of t, u, and v are not 0, and the value of (s+w) is less than (u+2v); and Y represents an oxygen atom, a divalent hydrocarbon group, or a group expressed by the general formula:

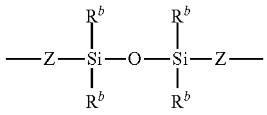

where $R^b$ is as defined above, and each Z is a divalent hydrocarbon group; and p represents a number from 1 to 10, r represents a number from 1 to 10, and q represents a number from 0 to 2; and wherein at least a portion of the reactive groups of component A2) are SiH groups.

17. The curable organopolysiloxane composition according to claim 16, wherein the resin structural block i) of component A2) has both $R^1SiO_{3/2}$ units and $SiO_{4/2}$ units.

18. A cured product, obtained from the curable organopolysiloxane composition according to claim 16.

19. An optical member, comprising the cured product according to claim 18.

20. A coating agent comprising the curable organopolysiloxane composition according to claim 16 and an organic solvent.

* * * * *